United States Patent
Steiner, III et al.

(10) Patent No.: US 9,540,243 B2
(45) Date of Patent: Jan. 10, 2017

(54) SYSTEMS AND METHODS FOR GROWTH OF NANOSTRUCTURES ON SUBSTRATES, INCLUDING SUBSTRATES COMPRISING FIBERS

(71) Applicant: Massachusetts Institute of Technology, Cambridge, MA (US)

(72) Inventors: Stephen A. Steiner, III, Cambridge, MA (US); Brian L. Wardle, Lexington, MA (US); Richard Li, West Windsor, NJ (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/216,487

(22) Filed: Mar. 17, 2014

(65) Prior Publication Data

US 2014/0295166 A1    Oct. 2, 2014

Related U.S. Application Data

(62) Division of application No. 13/408,984, filed on Feb. 29, 2012, now abandoned.
(Continued)

(51) Int. Cl.
*D01F 9/127* (2006.01)
*C01B 31/02* (2006.01)
(Continued)

(52) U.S. Cl.
CPC ............ *C01B 31/0293* (2013.01); *B82Y 30/00* (2013.01); *B82Y 40/00* (2013.01); *C01B 31/0206* (2013.01); *C01B 31/0226* (2013.01); *D01F 9/127* (2013.01); *D06M 11/45* (2013.01); *D06M 11/74* (2013.01); *D06M 11/79* (2013.01); *D06M 15/233* (2013.01); *D06M 15/263* (2013.01); *D06M 2101/40* (2013.01); *Y10T 428/249924* (2015.04); *Y10T 428/292* (2015.01); *Y10T 428/2918* (2015.01); *Y10T 428/2933* (2015.01); *Y10T 428/31504* (2015.04);
(Continued)

(58) Field of Classification Search
CPC .................. C01B 31/0293; C01B 31/0226
USPC ........................................ 423/447.3
See application file for complete search history.

(56) References Cited

U.S. PATENT DOCUMENTS 6,346,189 B1    2/2002  Dai et al.
7,537,825 B1    5/2009  Wardle et al.
(Continued)

FOREIGN PATENT DOCUMENTS

WO    WO 2007/136755 A2    11/2007
WO    WO 2008/034204 A2    3/2008
(Continued)

OTHER PUBLICATIONS

Definition of "catalyst," accessed online at: http://www.dictionary.com/browse/catalyst?s=t on Mar. 16, 2016.*
(Continued)

*Primary Examiner* — Daniel C McCracken
(74) *Attorney, Agent, or Firm* — Wolf, Greenfield & Sacks, P.C.

(57) ABSTRACT

Systems and methods for the formation of nanostructures, including carbon-based nanostructures, are generally described. In certain embodiments, substrate configurations and associated methods are described.

20 Claims, 16 Drawing Sheets

Related U.S. Application Data

(60) Provisional application No. 61/537,538, filed on Sep. 21, 2011.

(51) Int. Cl.
  B82Y 30/00   (2011.01)
  B82Y 40/00   (2011.01)
  D06M 11/45   (2006.01)
  D06M 11/74   (2006.01)
  D06M 11/79   (2006.01)
  D06M 15/233  (2006.01)
  D06M 15/263  (2006.01)
  D06M 101/40  (2006.01)

(52) U.S. Cl.
  CPC ............... *Y10T 428/31678* (2015.04); *Y10T 428/31935* (2015.04); *Y10T 442/20* (2015.04)

(56) References Cited

U.S. PATENT DOCUMENTS

| | | |
|---|---|---|
| 2007/0090489 A1 | 4/2007 | Hart et al. |
| 2008/0075954 A1 | 3/2008 | Wardle et al. |
| 2008/0118427 A1* | 5/2008 | Leon y Leon .......... D01F 9/225 423/447.2 |
| 2008/0170982 A1 | 7/2008 | Zhang et al. |
| 2008/0187648 A1 | 8/2008 | Hart et al. |
| 2009/0117363 A1 | 5/2009 | Wardle et al. |
| 2009/0311166 A1* | 12/2009 | Hart .......... B82B 1/00 423/445 B |
| 2010/0192851 A1 | 8/2010 | Shah et al. |
| 2010/0196695 A1 | 8/2010 | Garcia et al. |
| 2010/0255303 A1 | 10/2010 | Wardle et al. |
| 2010/0276072 A1 | 11/2010 | Shah et al. |
| 2010/0279569 A1 | 11/2010 | Shah et al. |
| 2011/0027162 A1 | 2/2011 | Steiner, III et al. |
| 2011/0142091 A1 | 6/2011 | Wardle et al. |
| 2011/0162957 A1 | 7/2011 | Wardle et al. |
| 2012/0135224 A1 | 5/2012 | Guzman de Villoria et al. |
| 2012/0164903 A1 | 6/2012 | Wardle et al. |

FOREIGN PATENT DOCUMENTS

| | | | |
|---|---|---|---|
| WO | WO 2008/054541 A2 | 5/2008 | |
| WO | WO 2009/029218 A2 | 3/2009 | |
| WO | WO 2009/110885 * | 9/2009 | ............. C01B 31/02 |
| WO | WO 2011/014258 A2 | 2/2011 | |

OTHER PUBLICATIONS

International Search Report and Written Opinion dated Dec. 3, 2012 in PCT/US2012/056608.
Bennett et al., Creating patterned carbon nanotube catalysts through the microcontact printing of block copolymer micellar thin films. Langmuir. 2006; 22:8273-8276.
Cao et al., Multifunctional brushes made from carbon nanotubes. Nature Materials. 2005; 4: 540-545.
Ci et al., Direct growth of carbon nanotubes on the surface of ceramic fibers. Carbon. 2005;43:883-886.
Coleman et al., Small but strong: A review of the mechanical properties of carbon nanotube-polymer composites. Carbon. 2006;44(9):1624-1652.
Derycke, V., et al. Catalyst-free growth of ordered single-walled carbon nanotube networks. Nano Letters, No. 10, Oct. 2002, pp. 1043-1046.
Downs et al., Modification of the surface properties of carbon fibers via the catalytic growth of carbon nanofibers. Journal of Materials Research. Mar. 1995;10(3):625-633.
Garcia et al., (Student Paper) Fabrication and Testing of Long Carbon Nanotubes Grown on the Surface of Fibers for Hybrid Composites. Presented at the 47th AIAA/ASME/ASCE/AJS/ASC Structures, Structural Dynamics, and Materials Conference, Newport, R.I., May 1-4, 2006.
Garcia et al., Fabrication and multifunctional properties of a hybrid laminate with aligned carbon nanotubes grown in situ. Compos Sci Technol. 2008;68:2034-2041.
Hart et al., Growth of conformal single-walled carbon nanotube films from Mo/Fe/Al$_2$O$_3$ deposited by electron beam evaporation. Carbon. Aug. 26, 2005; 44:348-359.
Hart et al., Force output, control of film structure, and microscale shape transfer by carbon nanotube growth under mechanical pressure. Nano Lett. Jun. 2006;6(6):1254-60.
Hart et al., Desktop growth of carbon-nanotube monoliths with in situ optical imaging. Small. May 2007;3(5):772-7.
Hart et al., Rapid growth and flow-mediated nucleation of millimeter-scale aligned carbon nanotube structures from a thin-film catalyst. J Phys Chem B. Apr. 27, 2006;110(16):8250-7.
Huang et al., Metal-catalyst-free growth of single-walled carbon nanotubes on substrates. J Am Chem Soc. Feb. 18, 2009;131(6):2094-5. doi: 10.1021/ja809635s.
Kis et al., Reinforcement of Single-Walled Carbon Nanotube Bundles by Intertube Bridging. Nature Materials, vol. 3(3), pp. 153-157, 2004.
Kusunoki et al., A formation mechanism of carbon nanotube films on SiC(0001). Appl. Phys. Lett. Jul. 24, 2000;77(4):531-533.
Lai et al., Role of concentration on the formation of zinc oxide nanorods from poly(styrene-alt-maleic acid) template. J. Phys. Chem. C. 2009; 113:18578-18583.
Li, et al., The synthesis of single-walled carbon nanotubes over an Al2O3/Fe2O3 binary aerogel catalyst. Journal of Physics:Conference Series, 26:308-311 (2006).
Liu et al., Growth of Single-Walled Carbon Nanotubes from Ceramic Particles by Alcohol Chemical Vapor Deposition. Appl. Phys. Exp. 2008; 1:014001.
Liu et al., Metal-catalyst-free growth of single-walled carbon nanotubes. J Am Chem Soc. Feb. 18, 2009;131(6):2082-3. doi: 10.1021/ja8093907.
Murakami et al., Direct Synthesis of High-Quality Single-Walled Carbon Nanotubes on Silicon and Quartz Substrates. Chem. Phys. Letts. 2003;377:49-54.
Press Release, Carbon Enhanced Reinforcements: A New Class of Engineered Materials. Accessed Nov. 2, 2011.
Qian, et al., "Hierarchical Composites Reinforced with Carbon Nanotube Grafted Fibers: The Potential Assessed at the Single Fiber Level," *Chemistry of Materials*, 20:1862-1869 (2008).
Rummeli et al., On the Graphitization Nature of Oxides for the Formation of Carbon Nanostructures. Chem. Mater. 2007;19(17):4105-4107.
Steiner et al., Nanoscale zirconia as a nonmetallic catalyst for graphitization of carbon and growth of single- and multiwall carbon nanotubes. J Am Chem Soc. Sep. 2, 2009;131(34):12144-54. doi: 10.1021/ja902913r.
Takagi, D., et al. Carbon Nanotube Growth from Semiconductor Nanoparticles. Nano Letters, vol. 7, No. 8, Jul. 2007, pp. 2272-2275.
Thostenson et al., Carbon nanotube/carbon fiber hybrid multiscale composites. J. Appl. Phys. 2002;91(9):6034-6037.
Vander Wal et al., Substrate-support interactions in metal-catalyzed carbon nanofiber growth. Carbon. Dec. 2001;39(15):2277-2289.
Veedu et al., Multifunctional composites using reinforced laminae with carbon-nanotube forests. Nat Mater. Jun. 2006;5(6):457-62. Epub May 7, 2006.
Yamamoto et al., High-yield growth and morphology control of aligned carbon nanotubes on ceramic fibers for multifunctional enhancement of structural composites. Carbon. Mar. 2009;47(3):551-560.

* cited by examiner

SYSTEMS AND METHODS FOR GROWTH OF NANOSTRUCTURES ON SUBSTRATES, INCLUDING SUBSTRATES COMPRISING FIBERS

RELATED APPLICATIONS

This application is a divisional of U.S. patent application Ser. No. 13/408,984, filed Feb. 29, 2012, and entitled "Systems and Methods for Growth of Nanostructures on Substrates, Including Substrates Comprising Fibers," which claims priority under 35 U.S.C. §119(e) to U.S. Provisional Patent Application Ser. No. 61/537,538, filed Sep. 21, 2011, and entitled "Methods for Growth of Nanostructures on Substrates Including Fibers," each of which is incorporated herein by reference in its entirety for all purposes.

TECHNICAL FIELD

Systems and methods for the formation of nanostructures, including carbon-based nanostructures, are generally described. In certain embodiments, substrate configurations and associated methods are described.

BACKGROUND

The production of nanostructures (including carbon-based nanostructures such as carbon nanotubes, carbon nanofibers, and the like) may potentially serve as an important tool in the production of emerging electronics and structural materials. Recent research has focused on the production of, for example, carbon nanotubes (CNTs) through chemical vapor deposition (CVD) and other techniques. The selection of an appropriate substrate on which to form the nanostructures is important when designing processes for the production of carbon nanostructures. Many commonly used substrate materials have one or more disadvantages associated with them. For example, some substrate materials may react during growth of the nanostructures, which can weaken the substrate and impede nanostructure growth. Substrates configured to avoid reaction or other degradation pathways would be desirable.

SUMMARY

Systems and methods for the formation of nanostructures, including carbon-based nanostructures, are provided. The subject matter of the present invention involves, in some cases, interrelated products, alternative solutions to a particular problem, and/or a plurality of different uses of one or more systems and/or articles.

In one aspect, an article is provided. The article comprises, in certain embodiments, a growth substrate; an intermediate material non-covalently associated with the growth substrate; and a nanopositor configured to promote the growth of carbon-based nanostructures from carbon-based nanostructure precursors associated with the intermediate material.

In certain embodiments, the article comprises an elongated carbon-based growth substrate, wherein the substrate has a tensile strength of at least about 1 GPa; and a plurality of substantially aligned carbon-based nanostructures positioned over the elongated carbon-based growth substrate.

In one aspect, a system for growing carbon-based nanostructures is described. In certain embodiments, the system comprises a growth substrate under a tensile force, and a nanopositor positioned over the growth substrate, wherein the system is configured to expose a carbon-based nanostructure precursor to the nanopositor under conditions causing the formation of carbon-based nanostructures on the nanopositor while the tensile force is applied to the growth substrate.

In one aspect, a method of growing carbon-based nanostructures is provided. The method comprises, in certain embodiments applying a tensile force to a growth substrate over which a nanopositor is positioned; and exposing a carbon-based nanostructure precursor to the nanopositor under conditions causing the formation of carbon-based nanostructures on the nanopositor while the tensile force is applied to the growth substrate.

In some embodiments, the method comprises exposing a carbon-based nanostructure precursor to a nanopositor under conditions causing the formation of carbon-based nanostructures on the nanopositor, wherein the nanopositor is associated with an intermediate material that is non-covalently associated with a growth substrate.

In certain embodiments, the method comprises exposing a ceramic-containing layer, positioned over an elongated carbon-based growth substrate, to a carbon-based nanostructure precursor under conditions causing the formation of substantially aligned carbon-based nanostructures on the ceramic-containing layer.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
FIGS. 1A-1C are schematic illustrations showing a system and method by which nanostructures can be produced over a substrate and an intermediate material, according to one set of embodiments.

Systems and methods for the formation of nanostructures, including carbon-based nanostructures, are generally described. In certain embodiments, substrate configurations and associated methods are described. In some embodiments, articles, systems, and methods for growing carbon-based nanostructures (including elongated carbon-based nanostructures such as carbon nanotubes, carbon nanofibers, and the like) on substrates such as carbon fibers are provided. Some embodiments involve preparing a substrate for growth of nanostructures on the substrate and/or on a nanopositor proximate the substrate.

The ability to grow nanostructures, such as carbon-based nanostructures, on a substrate while preserving the mechanical, electrical, and/or thermal properties of the substrate is desirable for a number of reasons. For example, the substrate on which nanostructures are grown might be recycled for use in subsequent growth processes. In other cases, the substrates themselves may be incorporated into the finally-assembled structure, the properties of which may be enhanced if the substrate is able to retain its toughness, strength, electrical conductivity, thermal conductivity, and/or other desirable properties. As one particular example, nanostructures may be grown on a fiber (e.g., a carbon fiber) which is subsequently incorporated into a composite material (e.g., by weaving or otherwise assembling the fiber with other components to form the composite). One architecture of particular interest includes one or more carbon fibers circumferentially coated with an array of aligned carbon nanotubes (CNTs), which can enable through-thickness and inter-ply matrix reinforcement of carbon fiber reinforced composites with multifunctional additional benefits such as providing electrical and thermal conductivity enhancement.

Many growth substrates on which it is desirable to grow nanostructures, such as carbon-based growth substrates, degrade when subjected to certain growth conditions used to grow the nanostructures. For example, growth of carbon nanotubes on carbon fibers via chemical vapor deposition often leads to substantial degradation of the tensile strength and/or stiffness of the carbon fiber substrates, making the carbon fiber substrate less useful for subsequent applications (either as a recycled growth substrate or as a component of a composite). It has been discovered, within the context of the present invention, that various substrate configurations can be adopted that can reduce or eliminate the degradation of the mechanical, electrical, and/or thermal properties of substrates comprising carbon and/or other vulnerable materials during the growth of nanostructures.

In one aspect, systems, articles, and methods are described in which an intermediate material is located between a growth substrate (e.g., a carbon fiber) and a nanopositor configured to promote the growth of nanostructures. Traditional nanostructure growth systems and methods load catalyst or catalyst precursor directly onto the growth substrate surface using, for example, incipient wetness techniques (e.g., dip-coating), in situ deposition of nanoparticles, e-beam evaporation of catalyst metal onto the substrate surface, and the like. Such approaches can be disadvantageous for a variety of reasons. For example, incipient wetness techniques generally require a wettable substrate surface in order to attach catalyst to the substrate, which can necessitate aggressive surface oxygenation through, for example, acid or electrochemical etching. Such processing can, in turn, alter the substrate surface morphology and reduce the substrate's ability to transmit tensile load. Additionally, each of the aforementioned traditional catalyst application approaches produces direct contact between the catalyst and the growth substrate, providing a configuration in which detrimental high-temperature interactions (e.g., carbide formation and/or catalytic restructuring of the substrate surface) can occur. Furthermore, such traditional configurations often produce nanostructure (e.g., nanotube) arrays that are unaligned; often, however, aligned or otherwise ordered nanostructures are more advantageous, for example, for nanoengineered composite architectures.

Positioning an intermediate material between the growth substrate and the nanopositor can reduce or eliminate the above-mentioned disadvantages. For example, the intermediate material can be configured, in certain embodiments, to inhibit or prevent interaction between the nanopositor and the growth substrate. Inhibiting or preventing interaction between the nanopositor and the growth substrate can reduce or eliminate damage to the growth substrate, for example, due to undesirable interactions between the nanopositor and the growth substrate. The intermediate material can be configured, in some embodiments, to inhibit or prevent interaction between the growth substrate and environmental agents, including nanostructure precursors used during nanostructure growth or other chemicals present in the growth atmosphere. In some embodiments, the intermediate material can be selected such that the wettability of the nanopositor material is enhanced. In addition, positioning an intermediate material between the nanopositor and the growth substrate can lead to enhanced alignment or other ordering of the elongated nanostructures grown from the nanopositor.

Figure 1B:
Figure 1B:
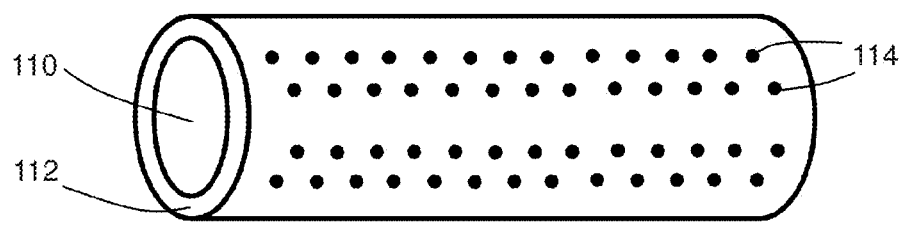
Figure 1C:
Figure 1C:
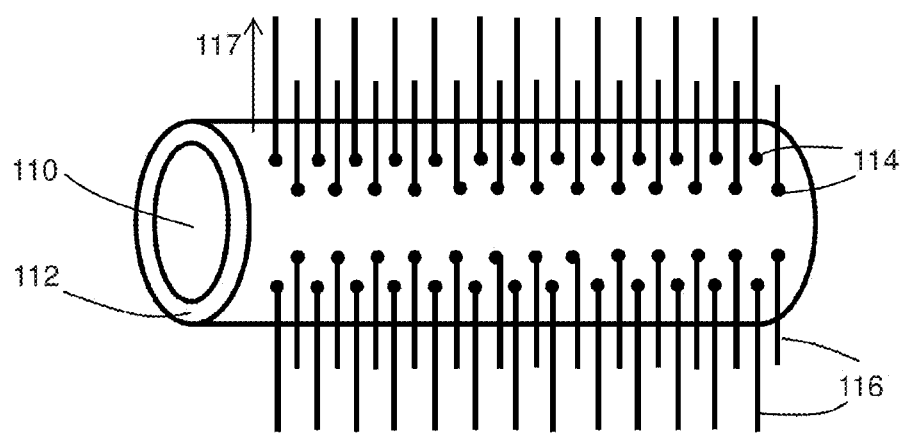

FIGS. 1A-1C are schematic diagrams illustrating the growth of nanostructures 116 on a growth substrate 110 in which an intermediate material 112 is employed. While an elongated, fiber substrate 110 is illustrated in FIGS. 1A-1C, it should be understood that the invention is not so limited, and, in other embodiments, growth substrates with other shapes (e.g., plates, spheres, etc.) can be employed.

In FIGS. 1A-1C, substrate 110 (e.g., a fiber such as a carbon fiber) is provided. In some embodiments, an intermediate material can be associated with the growth substrate. For example, in the set of embodiments illustrated in FIGS. 1A-1C, intermediate material 112 is positioned over growth substrate 110.

Intermediate material 112 and growth substrate 110 can be associated in a variety of manners. In certain embodiments, the growth substrate and the intermediate material can be non-covalently associated with each other. The non-covalent association between the intermediate material and the substrate can comprise a variety of interactions. For example, non-covalent association between the substrate and the intermediate material may be present in the form of, for example, van der Waals forces, for example, by physisorbing the intermediate material onto the substrate surface. In certain embodiments, an ionic bond, a hydrogen bond, a metal bond, or any other type of non-covalent bond may be formed between growth substrate 110 and intermediate material 112.

In some embodiments, the intermediate material may be capable of participating in a pi-pi interaction with the growth substrate. A pi-pi interaction (a.k.a., "pi-pi stacking") is a phenomenon known to those of ordinary skill in the art, and generally refers to a stacked arrangement of molecules adopted due to interatomic interactions. Pi-pi interactions can occur, for example, between two aromatic groups. One of ordinary skill in the art can determine whether a material (e.g., an intermediate material) is capable or participating in pi-pi interactions for a particular growth substrate.

The use of intermediate materials that participate in non-covalent interactions with the growth substrate can be advantageous as such use can inhibit or prevent interactions between the growth substrate and the intermediate material that negatively impact the mechanical, electrical, and/or thermal properties of the growth substrate. In addition, intermediate materials that non-covalently interact with the growth substrate can be selected such that they are removed relatively easily after nanostructure growth, which can be desirable in certain embodiments. Of course, the invention is not limited to non-covalent interactions between the growth substrate and the intermediate material, and in other embodiments (e.g., in some embodiments in which intermediate material 112 comprises a ceramic, as discussed in detail below), the intermediate material can be covalently bonded to the growth substrate.

A variety of types of intermediate materials can be used in association with the embodiments described herein. The intermediate material can comprise, in some embodiments, a polymer. For example, in some embodiments, the intermediate material can comprise poly(styrene-alt-[maleic acid]) and/or poly(styrene-alt-[maleic anhydride]). In some embodiments, the intermediate material can comprise an ion (e.g., a cation or an anion), such as at least a portion of a metal salt. Other examples of suitable polymers include, but are not limited to, poly(diallyldimethylammonium chloride), poly(styrene sulfonate), poly(allyl amine), and poly(acrylic acid). In certain embodiments, the polymer comprises a polyelectrolyte incorporating carboxylate, sulfonate, carbonate, bicarbonate, amine, ammonium, phosphate, and/or phosphonate groups, as described below.

In some embodiments, the intermediate material may comprise an aromatic group. The aromatic group may, in some cases, participate in one or more pi-pi interactions with the growth substrate. Examples of suitable aromatic groups include, but are not limited to, aryl groups (e.g., phenyl groups such as phenoxy groups, benzyl groups, tolyl groups, o-xylyl groups, and the like), and fused aromatic rings (e.g., napthalene, anthracene, pyrene, and the like), among others.

Other suitable intermediate materials (e.g., for non-covalent functionalization of the growth substrate) may include polymers or small molecules comprising both a hydrophobic moiety and a hydrophilic moiety in the same molecular structure.

In certain embodiments, the intermediate material provided for non-covalent functionalization comprises a polyelectrolyte. Suitable polyelectrolytes may include polymers comprising an aromatic side group and a side group suitable for ion exchange. One example of a suitable polyelectrolyte is the potassium salt of poly(styrene-alt-[maleic acid]). Other suitable polyelectrolytes (based on, for example, any of the polymers discussed above) may similarly incorporate carboxylate, sulfonate, carbonate, bicarbonate, amine, ammonium, phosphate, or phosphonate groups. In some embodiments, an intermediate layer that binds to the substrate is provided, and a second intermediate polyelectrolyte layer that binds to that intermediate layer is provided. The use of such materials can allow for advantageous methods of incorporating a nanopositor into the growth system, as discussed in more detail below.

The growth substrate and intermediate material can be arranged relative to each other in a variety of suitable ways. In some embodiments, the intermediate material can cover at least a portion of an exposed surface of the growth substrate. In some embodiments, the intermediate material can be present as a coating over at least a portion of the substrate. The intermediate material can form a uniform or a non-uniform coating over at least a portion (and in some cases, all) of the substrate. In some embodiments, the non-covalent functionalization process results in a substantially conformal coating over the contour surfaces of the substrate (e.g., fiber). This coating may be present in a thickness of one monolayer, several monolayers, or more. In certain embodiments, the coating (continuous, or otherwise) may be present in a thickness of from about 0.1 nm (e.g., which can be about the thickness of some monolayers and/or bilayers) to about 100 micrometers, from about 0.1 nm to about 1000 nm, from about 0.1 nm to about 100 nm, from about 1 nm to about 100 micrometers, from about 1 nm to about 1000 nm, or from 1 micrometers to about 100 micrometers. The coating composition and thickness may be characterized by scanning electron microscopy, transmission electron microscopy, Auger spectroscopy, X-ray photoelectron microscopy, profilometry, and/or other methods. In some embodiments, the intermediate material is present as a surface layer over the substrate. The intermediate material can be present, for example, as a monolayer, a bi-layer, several monolayers, etc. over the substrate.

In the set of embodiments illustrated in FIGS. 1A-1C, intermediate material 112 is present as a conformal coating over growth substrate 110. Of course, it should be understood that, in some embodiments, the intermediate material can be present as a non-conformal coating, as a patterned layer, or in any other suitable configuration, including those outlined above. In certain embodiments, one or more intermediate materials can cover at least about 50%, at least about 75%, at least about 90%, at least about 95%, at least about 99%, or substantially all of the growth substrate (e.g., carbon fiber) over which the intermediate material(s) are positioned.

In certain embodiments, a nanopositor material can be associated with the intermediate material and/or the growth substrate. In such embodiments, the nanopositor can be made of a different material than the intermediate material(s). In FIG. 1B, nanopositor material 114 can be positioned over intermediate material 112. In some such embodiments, substrate 110, intermediate material 112, and nanopositor 114 can be arranged such that intermediate material 112 is positioned between substrate 110 and nanopositor 114. That is to say, intermediate material 112 can be positioned over growth substrate 110 and/or nanopositor 114 can be positioned over intermediate material 112. In some embodiments, the nanopositor is in contact with the intermediate material. For example, the nanopositor can be, in some embodiments, covalently bonded to the intermediate material or ionically bonded to the intermediate material. In other embodiments, however, one or more materials can be positioned between intermediate material 112 and nanopositor 114.

The nanopositor can be added to the intermediate material and/or the growth substrate using any suitable method. For example, in certain embodiments, a nanopositor precursor (such as an $Fe^{3+}$ ion), a nanopositor nanoparticle (such as an Fe, Co, or Ni nanoparticle) or other nanopositor (including a non-metallic nanopositor (such as zirconia nanoparticles, polymer-coated zirconia nanoparticles, or carbon-coated zirconia nanoparticles)) may be provided on a surface of a growth substrate and/or an intermediate material. In some instances, the nanopositor precursor, nanopositor nanoparticle, or other nanopositor (e.g., non-metallic nanopositor) is included as part of the intermediate material used to non-covalently functionalize the carbon fiber surface. In certain embodiments, the nanopositor precursor, nanopositor nanoparticle, or other nanopositor (e.g., non-metallic nanopositor) is added after the substrate (e.g., fiber) is non-covalently functionalized. In some of these instances, the nanopositor precursor, nanopositor nanoparticle, or other nanopositor may participate in a chemical reaction with the intermediate material used to non-covalently functionalize the substrate surface. For example, a substrate over which a polyelectrolyte (e.g., a potassium salt of poly(styrene-alt-[maleic acid])) has been positioned may be dipped into an aqueous or non-aqueous solution of ions (e.g., $Fe^{3+}$ ions), resulting in an ion exchange process between an ion in the intermediate material (e.g., $K^+$ for a potassium salt) and the ions in the solution (e.g., $Fe^{3+}$). Ions in solution suitable for exchange with ions on the intermediate material (e.g., ions on a polyelectrolyte intermediate material) include ions of cobalt, nickel, molybdenum, zirconium, titanium, tantalum, silicon, aluminum, and/or other metals and metalloids. Such ions can, in certain embodiments, serve as nanopositors or precursors for nanopositors.

In certain embodiments, once the nanopositor has been associated with the growth substrate and/or intermediate material, a nanostructure precursor material can be used to grow nanostructures. For example, in some embodiments, a carbon-based nanostructure precursor can be exposed to the nanopositor under conditions causing the formation of carbon-based nanostructures on the nanopositor. In FIG. 1B, for example, a nanostructure precursor material, may be delivered to growth substrate 110, intermediate material 112, and/or nanopositor material 114. The nanostructure precursor material may contact or permeate a surface of growth substrate 110, a surface of intermediate material 112, and/or a surface of nanopositor material 114. In certain embodiments, after interaction between the nanostructure precursor material and nanopositor material 114, nanostructures 116 can be formed from nanopositor material 114, as illustrated in FIG. 1C.

Nanostructure precursor materials may be in any suitable phase (e.g., solid, liquid, or gas) and include, for example, hydrocarbons (e.g., methane, ethylene, acetylene, etc.), alcohols, and the like. In the growth of carbon nanotubes, for example, the nanostructure precursor material may comprise carbon, such that carbon dissociates from the precursor molecule and may be incorporated into the growing carbon nanotube, which is pushed upward from the growth substrate in general direction 117 with continued growth. Those of ordinary skill in the art would be able to select the appropriate nanostructure precursor material for the growth of a particular nanostructure. For example, carbon nanotubes may be synthesized by reaction of a $C_2H_4/H_2$ mixture with a nanopositor. Other examples of nanostructure precursor materials that may be used include, for example, methane, ethanol, methyl formate, acetylene, and other alkynes. Examples of suitable nanostructure fabrication techniques are discussed in more detail in International Patent Application Serial No. PCT/US2007/011914, filed May 18, 2007, entitled "Continuous Process for the Production of Nanostructures Including Nanotubes," published as WO 2007/136755 on Nov. 29, 2007, which is incorporated herein by reference in its entirety.

In certain embodiments, substrates prepared according to the methods described herein may be processed by chemical vapor deposition to cause growth of carbon-based nanostructures on the substrate surface. A chemical vapor deposition process may include providing thermal energy and providing a chemical atmosphere for a length of time which may result in the formation of carbon-based nanostructures. Substrates may be thermally processed in the presence of hydrogen or another reducing agent to help render any nanopositor precursor, or nanopositor on the substrate surface into a state suitable for facilitating growth of carbon-based nanostructures by chemical vapor deposition. In certain embodiments, a substrate prepared according to the methods described herein may be processed by chemical vapor deposition at a temperature below this specific temperature (e.g., at a temperature below about 600° C., below about 550° C., or below 500° C.) and still result in growth of carbon-based nanostructures. In some instances, a chemical vapor deposition process employing carbon dioxide and an alkyne may be used. In some of these instances, carbon dioxide and acetylene are present in a molar ratio of approximately 1:1.

In certain embodiments, one or more properties of the growth substrate (e.g., mechanical properties such as tensile strength, stiffness, compressive strength, porosity, and the like; electrical properties such as electronic conductivity; and/or thermal properties such as thermal conductivity) can be preserved after the one or more intermediate materials have been positioned (e.g., coated) over the growth substrate. In one set of embodiments, the tensile strength of the substrate (e.g., carbon fiber(s)) can be preserved after the one or more intermediate materials have been positioned (e.g., coated) over the growth substrate. That is to say, in certain embodiments, positioning the intermediate material(s) over the growth substrate does not result in substantial degradation of the tensile strength of the growth substrate. In some embodiments, the tensile strength of the substrate after positioning the intermediate material(s) over the growth substrate is less than about 20% lower, less than about 10% lower, less than about 5% lower, or less than about 1% lower than the tensile strength of the substrate prior to positioning the intermediate material(s) over the substrate. In some embodiments, the stiffness, compressive strength, porosity, electronic conductivity, and/or the thermal conductivity of the substrate after positioning the intermediate material(s) over the growth substrate is less than about 20% lower, less than about 10% lower, less than about 5% lower, or less than about 1% lower than the stiffness, compressive strength, porosity, electronic conductivity, and/or the thermal conductivity, respectively, of the substrate prior to positioning the intermediate material(s) over the substrate.

In some embodiments in which intermediate materials are employed, the tensile strength of the growth substrate (e.g., carbon fiber(s)) can be preserved during growth of carbon-based nanostructures. In some embodiments in which one or more intermediate materials have been positioned over the growth substrate, the tensile strength of the growth substrate after growth of the nanostructures is less than about 20% lower, less than about 10% lower, less than about 5% lower, or less than about 1% lower than the tensile strength of the substrate prior to growth of the nanostructures.

As noted above, the use of intermediate materials in the growth of nanostructures can provide a number of advantages. Such advantages include, for example, the ability to load a nanopositor precursor or nanopositor onto a substrate (e.g., carbon fiber) without etching, oxygenating, or otherwise damaging the substrate surface, which may result in a reduction in tensile strength, tensile stiffness, thermal conductivity, and/or electrical conductivity of the substrate. Other advantages include the ability to leverage facile atmosphere-compatible solution-based processing. Further advantages may include separation of the nanopositor precursor or nanopositor and the substrate surface, for example, by using the intermediate material as a sacrificial layer. Even further advantages include the ability grow carbon-based nanostructures on fiber fabrics (e.g., carbon fiber fabrics) such as weaves.

In one set of embodiments, intermediate material 112 comprises a ceramic-containing material. In some embodiments, the ceramic-containing material within intermediate material 112 can be covalently bonded to growth substrate 110. The use of ceramic-containing materials (e.g., metal oxides) can be advantageous in certain embodiments in which it is desirable to form aligned arrays of carbon-based nanostructures on carbon-based substrates, such as carbon fibers. In certain embodiments, the relatively smooth external surface provided by the ceramic-containing material can enhance the degree to which elongated nanostructures are aligned once produced at or near the surface of the intermediate material. The use of ceramic-containing materials as intermediate materials can also allow for relatively easy separation of the nanostructures from the growth substrate on which they are formed. For example, in certain embodiments, nanostructures can be removed by etching or otherwise removing the ceramic-containing material from between the growth substrate and the nanostructures.

Figure 2A:
FIGS. 2A-2B are, according to certain embodiments, schematic illustrations of a system and method by which nanostructures can be produced over a substrate and an intermediate material.
Figure 2B:
Figure 2B:
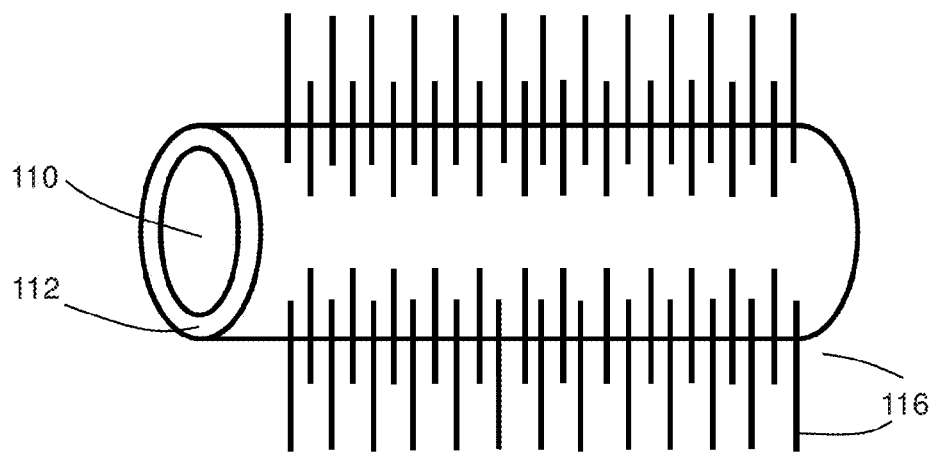

In some embodiments, nanostructures (e.g., carbon-based nanostructures) can be formed on a ceramic-containing material (e.g., in layer form) positioned over the growth substrate, with or without an additional nanopositor present. FIGS. 2A-2B are schematic diagrams of a system in which nanostructures 116 are grown directly on intermediate material 112, which can comprise a ceramic-containing material. In this set of embodiments, ceramic-containing intermediate layer 112 has been exposed to a carbon-based nanostructure precursor under conditions causing the formation of substantially aligned carbon-based nanostructures on the ceramic-containing layer. Of course, the invention is not limited to such embodiments, and in other embodiments, a nanopositor material 114 might also be added to the ceramic-containing material to produce nanostructures.

A variety of ceramic-containing materials can be used in intermediate materials, in association with the embodiments described herein. For example, intermediate material 112 can comprise a metal oxide, a metal nitride, a metal carbide, and/or a metal boride (e.g., an oxide, nitride, carbide, and/or boride of one or more of Al, Zr, Cr, Ba, Ca, Sr, Mg, Be, Na, K, Sc, Y, La, Ti, Hf, V, Nb, Ta, Mo, W, Mn, Fe, Co, Ni, B, Ga, In, C, Sn, S, and/or P). In certain embodiments, intermediate material 112 can comprise a metalloid oxide, a metalloid nitride, a metalloid carbide, and/or a metalloid boride, in addition to or in place of the metal oxide, metal nitride, metal carbide, and/or metal boride. For example, in certain embodiments, the intermediate material can comprise an oxide, nitride, carbide, and/or boride of Si, Ge, As, Sb, Te, and/or Po. In one particular set of embodiments, the intermediate material comprises an aluminum oxide, a titanium oxide, a magnesium oxide, and/or a silicon oxide.

Ceramic-containing materials can be formed over growth substrates (such as carbon fibers or other growth substrates) using a variety of methods. In certain embodiments, a ceramic-containing material can be formed over a growth substrate via a sol-gel technique. In some embodiments, a ceramic material can be formed over a growth substrate via chemical vapor deposition of a suitable precursor. Those of ordinary skill in the art, given the present disclosure, would be capable of determining other methods by which ceramic-containing material could be formed over a growth substrate.

In some embodiments, the ceramic-containing material within intermediate material 112 comprises an aluminum oxide. Aluminum oxide can be formed on growth substrate 110 using any suitable method. For example, in one set of embodiments, a substrate (e.g., comprising carbon fibers) is exposed to an aluminum alkoxide at elevated temperatures. A coating (e.g., a substantially conformal coating) of alumina may result over the contour surfaces of the substrate, resulting in a surface layer of alumina. In another set of embodiments, a sol-gel-based process is used to deposit a coating (e.g., a substantially conformal coating) of alumina over a surface of the substrate. Optionally, a nanopositor precursor or a nanopositor may then be provided onto the surface layer of alumina. The coated fiber then may be subsequently processed by chemical vapor deposition resulting in the formation of an array of carbon-based nanostructures which are substantially oriented (e.g., aligned or otherwise ordered) along their lengths relative to one another.

In certain embodiments, the ceramic-containing layer can be in direct contact with growth substrate 110. The invention is not so limited, however, and in other embodiments, one or more materials can be positioned between the growth substrate and the ceramic-containing layer. For example, in certain embodiments, an intermediate material that is non-covalently associated with growth substrate 110 can be positioned between growth substrate 110 and the ceramic-containing layer.

In another aspect, systems, articles, and methods are described in which the growth substrate is under tension (e.g., due to an applied tensile force) during nanostructure growth. It has been unexpectedly discovered, within the context of the invention, that applying a tensile force to a substrate during nanostructure growth can lead to enhanced mechanical, thermal, and/or electrical properties of the substrate after growth. For example, in certain embodiments, when a tensile force is applied to a growth substrate (such as a fiber) during nanostructure growth, the tensile strength of the growth substrate after growth can be enhanced, relative to the post-growth tensile strength that would be observed in the absence of the tension during growth but under otherwise essentially identical conditions.

Not wishing to be bound by any particular theory, it is believed that the application of tension during nanostructure growth can lead to favorable alignment of the molecules of the growth substrate, reducing the degree to which the tensile strength of the growth substrate is reduced during growth. During manufacture of high-tensile-strength carbon fiber, the fiber is often put under a high degree of tension. This can result in the kinetic trapping of a highly oriented microstructure in the fiber. This microstructure can become thermally activated above a fiber-specific temperature, and the orientation and high degree of overlap among grapheme domains can change, which can result in a loss of tensile strength and stiffness in the fiber. For example, in some embodiments in which carbon-based growth substrates are employed, it is believed that, at relatively high growth temperatures (e.g., temperatures above about 500° C., or higher), the component graphene (e.g., sheets, ribbons, etc.) can become kinetically activated, which can allow these components to shift. It is believed that, absent tension, the component graphene unfurls and rearranges randomly, negatively affecting tensile strength. On the other hand, it is believed that, when tension is applied, alignment of the component graphene is actively maintained in a direction that is favorable for the material properties of the growth substrate.

Figure 3A:
FIGS. 3A-3C are, according to some embodiments, schematic illustrations of a system and method by which nanostructures can be produced over a substrate, optionally with an intermediate material, while a tensile force is applied to the substrate.
Figure 3B:
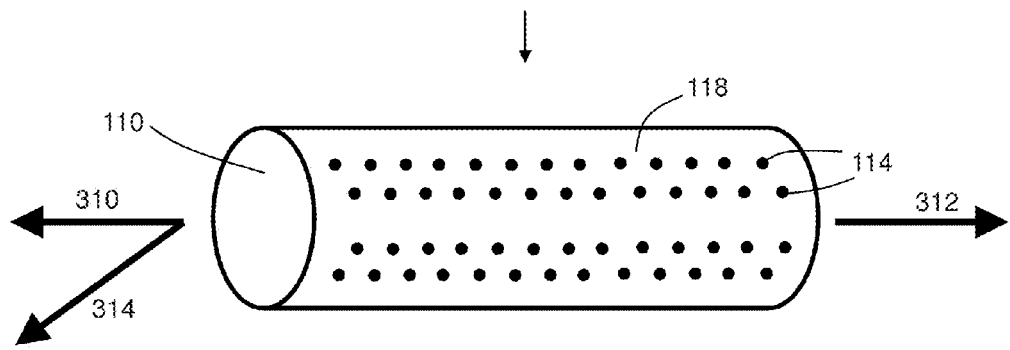
Figure 3C:
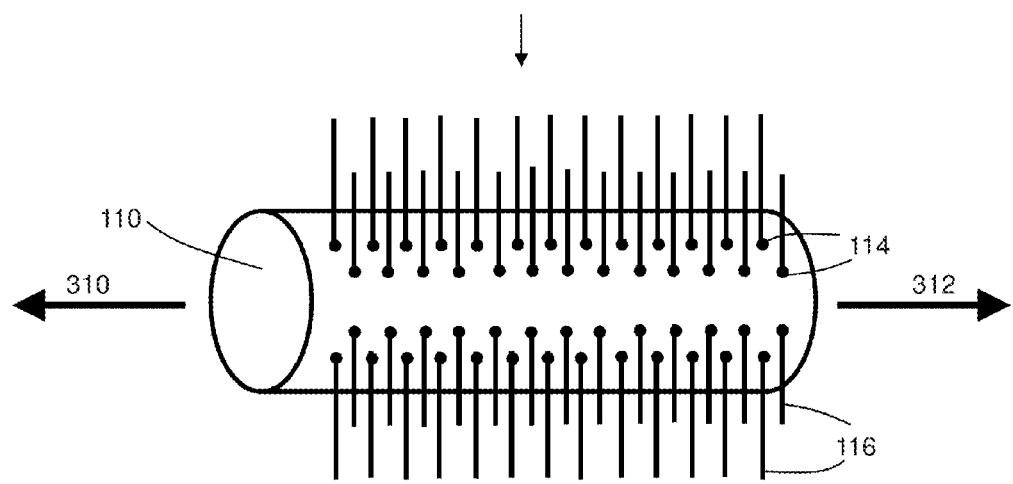

FIGS. 3A-3C illustrate one set of embodiments in which a tensile force is applied to a growth substrate during nanostructure growth. In this set of embodiments nanopositor material 114 is positioned over growth substrate 110 (e.g., a carbon fiber). In some embodiments, the nanopositor can be in direct contact with the growth substrate during the application of the tensile force and/or during growth of the carbon-based nanostructures. For example, in FIGS. 3B-3C, nanopositor material 114 is in direct contact with growth substrate 110.

While FIGS. 3B-3C illustrate nanopositor material 114 in direct contact with growth substrate 110, in other embodiments, one or more materials (e.g., any of intermediate materials 112 described elsewhere) can be positioned between the growth substrate 110 and nanopositor material 114 during nanostructure growth while tension is applied. In certain embodiments, the substrate (e.g., a fiber) may have one or more substantially conformal coatings of various substances over its contour surfaces, for example, forming a surface layer. A nanopositor precursor or a nanopositor may be present on the substrate (e.g., fiber) surface and/or on the surface of the intermediate material (e.g., conformal coating).

As noted above, a tensile force can be applied to the growth substrate, in certain embodiments. For example, in the set of embodiments illustrated in FIGS. 3B-3C, a tensile force can be applied to growth substrate 110 by applying forces having components in the direction of arrow 310 and/or arrow 312. Tensile forces can be applied to substrates using any methods known to those of ordinary skill in the art. For example, in some embodiments, the ends of the substrate can be affixed to a stationary or movable mount using, for example, clamps, an adhesive, and interlocking mechanism, or via any other suitable mechanism. Subsequently, one or both of the clamped ends can be moved away from the other, imparting a tensile stress on the substrate.

The tensile force can be imparted to the growth substrate at any suitable level and/or in any suitable direction. In certain embodiments, the magnitude and/or the direction of the tensile force can be selected such that the applied force enhances the tensile strength of the growth substrate after growth of the nanostructures (including exposure to a temperature within any of the ranges described herein) relative to the tensile strength that would be observed in the absence of the tensile force but under otherwise essentially identical conditions. "Essentially identical conditions," in this context, means conditions that are similar or identical other than the application and/or magnitude of the tensile force. For example, otherwise identical conditions may mean, in certain embodiments, a growth substrate, intermediate material, nanopositor, and nanostructure precursor that are identical; nanostructure growth conditions (e.g., temperature, atmosphere, pressure, growth time, etc.) that are identical; but where the growth substrate is not constructed (e.g., by brackets or other connections) to apply the anisotropic force on the subject growth substrate. In certain embodiments, the magnitude and/or direction of the applied tensile force can be selected such that the post-growth tensile strength of the growth substrate is enhanced by at least about 1%, at least about 5%, at least about 10%, or at least about 25% (and, in some cases, by less than about 50%), relative to the tensile strength of the growth substrate that would be observed in the absence of the applied tensile force but under otherwise essentially identical conditions.

In some embodiments, the magnitude of the tensile force can be such that it defines an engineering strain in the growth substrate in at least one direction of, for example, at least about 0.0001%, at least about 0.001%, at least about 0.01%, or at least about 0.1% (and, in some embodiments, less than about 5%, less than about 2%, or less than about 1%). One of ordinary skill in the art would be capable of determining the amount of engineering strain imparted to a given growth substrate by measuring the length (L) of the growth substrate just prior to application of the tensile force and during growth (i.e., at the temperature, pressure, and other conditions at which growth occurs), measuring the length (l) of the growth substrate after the application of the tensile force and during growth, and calculating the engineering strain (e) as follows:

$$e = \frac{l-L}{L} \times 100\% \qquad [1]$$

In some embodiments, the magnitude of the tensile force can be such that it defines a stress of, for example, greater than about 1 kPa, greater than about 10 kPa, greater than about 100 kPa, greater than about 1 MPa, greater than about 25 MPa, greater than about 75 MPa, greater than about 250 MPa, greater than about 500 MPa, greater than about 1 GPa, or greater than about 10 GPa.

The magnitude of the tensile force may be such that it defines a stress of, for example, greater than about 1%, greater than about 5%, or greater than about 10% of the breaking strength of the substrate (e.g., fiber) (and/or, in some embodiments, less than about 75%, less than about 60%, less than about 45%, less than about 30%, less than about 20%, or less than about 15% of the breaking strength of the substrate (e.g., fiber)). In this context, the breaking strength of a substrate (e.g., fiber) is determined by breaking a representative number of similar substrates (i.e., substrates originating from the same manufacturing lot as the substrate being used) and number averaging these values, as described in Example 8. For example, to determine the breaking strength of a carbon fiber a priori, one of ordinary skill in the art would determine the breaking strength of a representative number of similar carbon fibers (e.g., carbon fibers sourced from the same manufacturing lot) and taking the average of the measured breaking strengths.

Suitable techniques for measuring the breaking strength of a single fiber (e.g., a carbon or graphite fiber) can be found, for example, in ASTM standard test D3379-75 ("Standard Test Method for Tensile Strength and Young's Modulus for High-Modulus Single-Filament Materials," 1989), which is incorporated herein by reference in its entirety for all purposes. ASTM standard test C1557-03 ("Standard Test Method for Tensile Strength and Young's Modulus of Fibers," ASTM International, West Conshohocken, Pa., 2003) could also be used and is expected to provide similar results. Suitable techniques for measuring the breaking strength of other substrates may be found, for example, in M. Madou, "Fundamentals of Microfabrication," 2nd edition, CRC Press (2002), which is incorporated herein by reference in its entirety.

In certain embodiments, the tensile force applied to the growth substrate can include a component that is oriented in a direction that is parallel to the external surface of the growth substrate from which nanostructures are grown. In this context, the "external surface of the growth substrate" refers to the geometric surface of the growth substrate, which will be understood by those of ordinary skill in the art to refer to the surface defining the outer boundaries of the growth substrate, and does not include the internal surface area (e.g., area within pores of a porous material such as a foam, or surface area of those fibers of a mesh that are contained within the mesh and do not define the outer boundary, etc.).

For example, in the set of embodiments illustrated in FIG. 3B, a force applied in the direction of arrow 314 would include component 310, which is parallel to the external surface 118 of growth substrate 310 on which nanopositor material 114 is deposited and from which nanostructures 116 are grown. In some embodiments, the component of the applied force that is parallel to the external surface of the growth substrate from which the nanostructures are grown has a magnitude that lies within any of the ranges described in the preceding paragraphs and/or defines a strain that lies within any of the ranges within the preceding paragraphs.

In certain embodiments, the direction in which the tensile force is applied is substantially parallel to the external surface of the growth substrate from which the nanostructures are grown. That is to say, in certain embodiments, the tensile force is applied in a direction that defines a largest angle with the external surface of the growth substrate that is less than about 5°, less than about 2°, less than about 1°, or less than about 0.1°. For example, in FIG. 3B, a tensile force applied to growth substrate 110 in the direction of arrow 310 defines a largest angle with external surface 118 of growth substrate 110 that is about 0°, and thus, a force applied in the direction of arrow 310 would be substantially parallel to external surface 118.

In some embodiments, while the tensile force is applied to the growth substrate, a carbon-based nanostructure precursor can be exposed to the nanopositor under conditions causing the formation of carbon-based nanostructures on the nanopositor. In FIG. 3C, for example, nanopositor 114 can be exposed to carbon-based nanostructure precursor materials, resulting in the formation of nanostructure 116. The nanostructures can be grown, for example, using any of the techniques and procedures outlined above with respect to FIGS. 1A-1C and FIGS. 2A-2B.

In one particular set of embodiments, carbon fibers are tensioned at temperatures and/or other conditions suitable for chemical vapor deposition growth of carbon-based nanostructures. The tensioned carbon fiber may then be exposed to a chemical atmosphere that results in the formation of carbon-based nanostructures. In some instances, this chemical atmosphere may comprise an inert gas, hydrogen, carbon dioxide, carbon monoxide, an alkane, an alkene, an alkyne, water, an alcohol, ferrocene, or an aromatic compound. In some instances, carbon-based nanostructures result. In some of these instances, the substrate (e.g., carbon fiber) exhibits a higher tensile strength than in a similar process where tension is not applied.

Application of tensile forces to nanostructure growth substrates can provide a number of advantages. For example, such systems and methods can allow one to grow carbon-based nanostructures (including carbon nanotubes) on substrates such as carbon fibers at the temperatures suitable for chemical vapor deposition (e.g., greater than 650° C.), without subjecting the substrate to substantial tensile strength and/or tensile stiffness degradation (which is often observed in many traditional growth processes that do not employ tension, at temperatures of, for example, above about 500° C.). Additionally, the application of tensile forces to growth substrates can be easily integrated into existing growth substrate manufacturing processes (e.g., carbon fiber manufacturing processes), many of which apply tension to substrates (e.g., fibers) during production of the substrates.

In some embodiments, the application of a tensile force to the growth substrate (e.g., carbon fiber) during nanostructure growth can enhance the post-growth tensile strength of the growth substrate. In certain cases, the tensile strength of the growth substrate can be preserved even after carbon-based nanostructure growth a relatively high temperatures (e.g., temperatures above about 600° C.). In some embodiments in which a tensile force is applied during nanostructure growth, the tensile strength of the substrate after growth of the nanostructures is less than about 20% lower, less than about 10% lower, less than about 5% lower, or less than about 1% lower than the tensile strength of the substrate prior to growth of the nanostructures.

The systems and methods described herein can be used to produce nanostructures over elongated, carbon-based substrates (e.g., carbon fibers) while maintaining a relatively high tensile strength of the elongated, carbon-based substrates. In certain embodiments, the tensile strength of an elongated carbon-based growth substrate can be at least about 1 GPa, at least about 2 GPa, at least about 3 GPa or at least about 4 GPa (and, in some instances, less than about 5 GPa) after nanostructures have been grown over the growth substrate.

In certain embodiments, the articles, systems, and methods described herein can be used to grow substantially aligned nanostructures (i.e., such that the longitudinal axes of the nanostructures are substantially aligned relative to each other). For example, in FIGS. 1C, 2B, and 3C, nanostructures 116 are substantially aligned with one another.

In certain embodiments, each nanostructure within a plurality of nanostructures is positioned relative to an adjacent nanostructure at a distance so as to together define an average distance between adjacent nanostructures. In the set of embodiments illustrated in FIGS. 1C, 2B, and 3C, the average distance between adjacent nanostructures is roughly equal for each nanostructure. In other embodiments, the distances between adjacent nanostructures may vary.

The aligned nanostructures can be positioned, for example, side-by-side relative to each other, as illustrated in FIGS. 1C, 2B, and 3C. In some embodiments, the nanostructures can be grown such that the plurality of nanostructures extends a distance at least 10 times greater than the average distance between adjacent nanostructures in each of two orthogonal directions, each direction perpendicular to the long axes of the nanostructures. In some cases, the plurality of nanostructures extends, in two orthogonal directions each perpendicular to the long axes of the nanostructures, a distance at least 100 times greater, at least 1000 times greater, at least 10,000 times greater or longer than the average distance between adjacent nanostructures.

Figure 4:
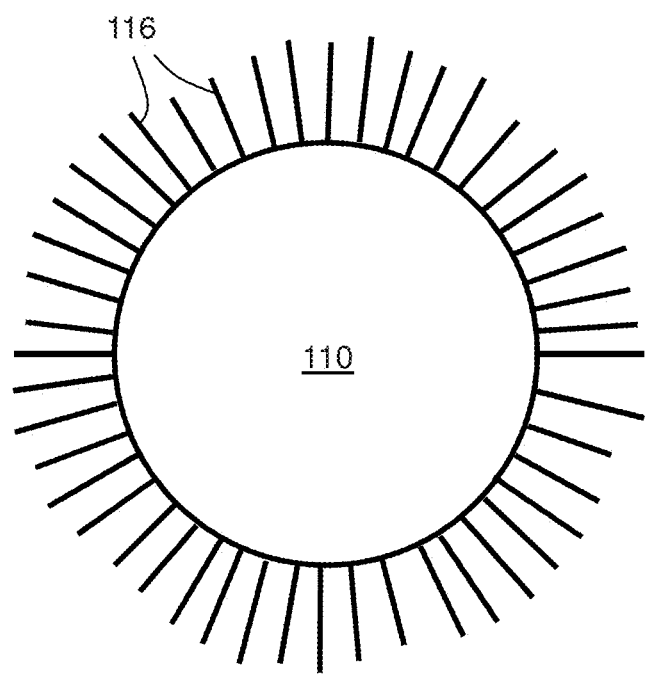
FIG. 4 is a schematic illustration of carbon nanotubes positioned over a growth substrate, according to some embodiments.

In certain embodiments, the aligned nanostructures can be non-parallel to the external surface of the growth substrate (e.g., surface 118 in FIG. 3B). In some embodiments, the aligned nanostructures can be substantially perpendicular to the external surface of the growth substrate at the point of contact. For a non-planar growth substrate, the angle between the nanostructure and the growth substrate surface is measured relative to a plane tangent to the external surface of the growth substrate at the point at which the longitudinal axis of the nanostructure intersects the external surface of the growth substrate. FIG. 4 is a cross-sectional schematic illustration of an elongated growth substrate 110 on which nanostructures 116 have been formed. In FIG. 4, substrate 110 can correspond to a substantially cylindrical substrate, such as a fiber. In the set of embodiments illustrated in FIG. 4, the as-grown nanostructures 116 are arranged such that the longitudinal axes of the nanostructures extend in a direction normal to the external surface of the growth substrate 110 from which they are grown.

A variety of growth substrates may be used in accordance with the systems and methods described herein. Growth substrates may comprise any material capable of supporting nanopositors and/or nanostructures as described herein. The growth substrate may be selected to be stable under the conditions described herein. In some cases, the growth substrate comprises a substantially flat surface. In some cases, the growth substrate comprises a substantially non-planar surface. For example, the growth substrate may comprise a cylindrical surface.

In some embodiments, the growth substrate comprises a fiber, such as a carbon fiber. In some embodiments, the growth substrate can be elongated. For example, the ratio of the length of the growth substrate (e.g., a fiber substrate) to the diameter or other cross-sectional dimension of the growth substrate can be, in some embodiments, at least about 2:1; at least about 3:1; at least about 5:1; at least about 10:1; at least about 50:1; at least about 100:1; at least about 500:1; at least about 1000:1; at least about 10,000:1; at least about 100,000:1; at least about $10^6$:1; at least about $10^7$:1; at least about $10^8$:1; or at least about $10^9$:1.

In certain embodiments, fibers (e.g., carbon fibers) used as growth substrates can have relatively large cross-sectional dimensions (e.g., relative to the nanostructures formed over the fiber substrate). For example, in certain embodiments, a fiber growth substrate can have a smallest cross-sectional dimension of at least about 1 micrometer, at least about 5 micrometers, or at least about 10 micrometers (and/or, in certain embodiments, less than about 1 mm, less than about 100 micrometers, or less than about 20 micrometers). Generally, the smallest cross-sectional dimension is measured perpendicularly to the length of the fiber and through the longitudinal axis of the fiber.

In some embodiments, the growth substrate can comprise a fiber that is part of a bundle of fibers. For example, in certain embodiments, the growth substrate can comprise a fiber that is part of a tow, a weave, or a yarn of fibers. In certain embodiments, the growth substrate can comprise a fiber that is substantially free of contact with other fibers.

The growth substrate can comprise a variety of materials. In some embodiments, the substrate can comprise carbon (e.g., amorphous carbon, carbon aerogel, carbon fiber, graphite, glassy carbon, carbon/carbon composite, graphene, aggregated diamond nanorods, nanodiamond, diamond, and the like). In some embodiments, the growth substrate can comprise a polymer. In certain embodiments, at least about 50 wt %, at least about 75 wt %, at least about 90 wt %, at least about 95 wt %, or at least about 99 wt % of the substrate can be made of polymer). In some embodiments, the growth substrate can comprise a glass. In certain embodiments, at least about 50 wt %, at least about 75 wt %, at least about 90 wt %, at least about 95 wt %, or at least about 99 wt % of the substrate can be made of glass). Substrates suitable for use in the invention include high-temperature prepregs, high-temperature polymer resins, inorganic materials such as metals, alloys, intermetallics, metal oxides, metal nitrides, ceramics, and the like. As used herein, the term "prepreg" refers to one or more layers of thermoset or thermoplastic resin containing embedded fibers, for example fibers of carbon, glass, silicon carbide, and the like. In some cases, the substrate may be a fiber, tow of fibers, a weave (e.g., a dry weave), and the like. The substrate may further comprise a conducting material, such as conductive fibers, weaves, or nanostructures. Examples of suitable polymers that can be used in the growth substrate include, but are not limited to, relatively high temperature fluoropolymers (e.g., Teflon®), polyetherether ketone (PEEK), and polyether ketone (PEK), and the like.

In some embodiments, the substrate and the nanopositor can be selected such that they would be reactive with each other if in direct contact and exposed to the growth conditions under which the carbon-based nanostructures are grown (e.g., temperatures of greater than about 600° C., for some embodiments).

In certain embodiments, carbon-based growth substrates such as carbon fibers can be employed. In some embodiments, the carbon-based growth substrate contains carbon in an amount of at least about 75 wt %, at least about 90 wt %, at least about 95 wt %, or at least about 99 wt %. That is to say, in some embodiments, at least about 75 wt %, at least about 90 wt %, at least about 95 wt %, or at least about 99 wt % of the carbon-based growth substrate is made of carbon.

As noted elsewhere, in one set of embodiments, the growth substrate comprises one or more carbon fibers. Any suitable type of carbon fiber can be employed including, for example, aerospace-grade carbon fibers, auto/sport grade carbon fibers, and/or microstructure carbon fibers. In certain embodiments, intermediate modulus (IM) or "high modulus (HM) carbon fibers can be employed. In some embodiments, poly(acrylonitrile)-derived carbon fibers can be employed. Certain embodiments of the invention are advantageous for use with carbon fibers that carry a large degree of their tensile strengths in their outer skins (e.g., fibers in which at least about 50%, at least about 75%, or at least about 90% of the tensile strength is imparted by the portion of the fiber located a distance away from the outer skin of the fiber of less than about 0.1 times or less than about 0.05 times the cross-sectional diameter of the fiber), such as aerospace grade intermediate modulus carbon fibers.

Carbon fibers, including poly(acrylonitrile)-derived carbon fibers, can be particularly challenging substrates upon which to grow nanostructures such as carbon nanotubes using traditional methods for a number of reasons. For example, it is believed that the majority of the tensile load carried by a carbon fiber is transmitted in the outer skins of the fiber; as such, any disruption to the surface can result in a disproportionate loss of tensile properties. Many commonly employed nanostructure catalysts (e.g., metals such as Fe, Ni, etc.) react with or dissolve carbon at nanostructure growth temperatures (e.g., 700° C. to 900° C.), which can degrade the carbon fiber. In addition, the carbon within carbon fibers can react with oxygen, water, and hydrogen at temperatures above 400° C., and many substances commonly found in the environment (e.g., $Na^+$ and $K^+$ ions from human skin) can catalyze microstructural transformations in carbon at these temperatures. The outer surface of carbon fibers is also generally highly graphitic and therefore presents a low wettability with few active binding sites to which traditional coatings can be applied; frequently acid or electrochemical etching the surface of the carbon fiber is required to overcome the wettability problem. In addition, aligned growth of nanostructures such as carbon nanotubes is not natively facilitated on carbon substrates and generally requires the presence of specific support materials. As such, it has traditionally been challenging to adhere catalyst materials for nanostructure growth to the fiber surface without adding a chemical step that circumstantially results in reduction of fiber tensile properties. In addition, even if the catalyst material can be applied and adhered without such a treatment using traditional methods (e.g., through in situ deposition of floating catalyst particles during nanostructure growth), damage to the carbon fiber is likely to result at the temperatures at which nanostructures such as carbon nanotubes are grown. The systems, articles, and methods described herein address these issues and generally allow for more effective growth of nanostructures such as carbon nanotubes on carbon fibers.

Of course, the invention is not limited to the use of growth substrates comprising carbon, and other growth substrate materials can be used. Other examples of suitable growth substrate materials (e.g., materials that are vulnerable to degradation when traditional methods are employed, but display improved post-growth mechanical, thermal, and/or electrical properties when used in association with the embodiments described herein) include, but are not limited to, boron-based growth substrates (e.g., boron fibers), glass- or quartz-based substrates (e.g., glass or quartz fibers), ceramic substrates (e.g., ceramic fibers, including fibers comprising aluminum oxide), and polymer substrates (e.g., polymer fibers).

As used herein, the term "carbon-based nanostructure" refers to articles having a fused network of aromatic rings, at least one cross-sectional dimension of less than about 1 micrometer, and comprising at least about 30% carbon by mass. In some embodiments, the carbon-based nanostructures may comprise at least about 40%, at least about 50%, at least about 60%, at least about 70%, at least about 80%, at least about 90%, or at least about 95% of carbon by mass, or more. The term "fused network" might not include, for example, a biphenyl group, wherein two phenyl rings are joined by a single bond and are not fused. Example of carbon-based nanostructures include carbon nanotubes (e.g., single-walled carbon nanotubes, double-walled carbon nanotubes, multi-walled carbon nanotubes, etc.), carbon nanowires, carbon nanofibers, carbon nanoshells, graphene, fullerenes, and the like.

In some embodiments, the carbon-based nanostructure can be an elongated structure. In some embodiments, a carbon-based nanostructure may have an aspect ratio of at least about 2:1; at least about 3:1; at least about 5:1; at least about 10:1; at least about 50:1; at least about 100:1; at least about 500:1; at least about 1000:1; at least about 10,000:1; at least about 100,000:1; at least about $10^6$:1; at least about $10^7$:1; at least about $10^8$:1; or at least about $10^9$:1.

In some embodiments, a carbon-based nanostructure may have a least one cross-sectional dimension of less than about 500 nm, less than about 250 nm, less than about 100 nm, less than about 75 nm, less than about 50 nm, less than about 25 nm, less than about 10 nm, or, in some cases, less than about 1 nm. Carbon-based nanostructures described herein may have, in some cases, a maximum cross-sectional dimension of less than about 1 micrometer, less than about 500 nm, less than about 250 nm, less than about 100 nm, less than about 75 nm, less than about 50 nm, less than about 25 nm, less than about 10 nm, or, in some cases, less than about 1 nm.

In some embodiments, the carbon-based nanostructures described herein may comprise carbon nanotubes. As used herein, the term "carbon nanotube" is given its ordinary meaning in the art and refers to a substantially cylindrical molecule or nanostructure comprising a fused network of primarily six-membered rings (e.g., six-membered aromatic rings) comprising primarily carbon atoms. In some cases, carbon nanotubes may resemble a sheet of graphite formed into a seamless cylindrical structure. It should be understood that the carbon nanotube may also comprise rings or lattice structures other than six-membered rings. Typically, at least one end of the carbon nanotube may be capped, i.e., with a curved or nonplanar aromatic structure. Carbon nanotubes may have a diameter of the order of nanometers and a length on the order of millimeters, or, on the order of tenths of micrometers, resulting in an aspect ratio greater than 100, 1000, 10,000, 100,000, $10^6$, $10^7$, $10^8$, $10^9$, or greater. Examples of carbon nanotubes include single-walled carbon nanotubes (SWNTs), double-walled carbon nanotubes (DWNTs), multi-walled carbon nanotubes (MWNTs) (e.g., concentric carbon nanotubes), inorganic derivatives thereof, organic derivatives thereof, and the like. In some embodiments, the carbon nanotube is a single-walled carbon nanotube. In some cases, the carbon nanotube is a multi-walled carbon nanotube (e.g., a double-walled carbon nanotube). In some cases, the carbon nanotube comprises a multi-walled or single-walled carbon nanotube with an inner diameter wider than is attainable from a traditional catalyst or other nanopositor material. In some cases, the carbon nanotube may have a diameter less than about 1 micrometer, less than about 500 nm, less than about 250 nm, less than about 100 nm, less than about 50 nm, less than about 25 nm, less than about 10 nm, or, in some cases, less than about 1 nm.

As used herein, the term "nanopositor" refers to a material that, when exposed to a set of conditions selected to cause formation of nanostructures, either enables formation of nanostructures that would otherwise not occur in the absence of the nanopositor under essentially identical conditions, or increases the rate of formation of nanostructures relative to the rate that would be observed under essentially identical conditions but without the nanopositor material. "Essentially identical conditions," in this context, means conditions that are similar or identical (e.g., pressure, temperature, composition and concentration of species in the environment, etc.), other than the presence of the nanopositor. In one set of embodiments, a "nanopositor" is not consumed in a reaction involving the formation of nanostructures which it enables or for which it increases the rate, i.e., atoms or molecules that make up the nanopositor are not, via reaction, incorporated into the nanostructure. In some embodiments, a nanopositor can comprise a catalyst. In some embodiments, a nanopositor can be configured to promote the growth of carbon-based nanostructures from carbon-based nanostructure precursors. For example, the nanopositor material can be selected such that, when the nanopositor is exposed to a given set of reaction conditions and/or nanostructure precursor material, carbon-based nanostructures are produced.

Any suitable nanopositor can be used in association with the embodiments described herein. In some embodiments, the nanopositor can comprise an elemental metal and/or a metal oxide. The nanopositor can comprise, in some embodiments iron, such as elemental iron. In some embodiments, the nanopositor can include a metal in a zero-oxidation state (e.g., during growth of the nanostructures). Exemplary zero oxidation state metals include, but are not limited to, iron, cobalt, nickel, platinum, gold, copper, rhenium, tin, tantalum, aluminum, palladium, rhodium, silver, tungsten, molybdenum, zirconium, or any other suitable metal. In some embodiments, the nanopositor includes metal or metalloid atoms in a non-zero oxidation state (e.g., during growth of the carbon-based nanostructures). In some instances, the nanopositor and/or nanopositor support may comprise metal oxides or metal chalcogenides (e.g., metal sulfides, metal selenides, metal tellurides, etc.). In some embodiments, the nanopositor or nanopositor support may comprise metalloid oxides or metalloid chalcogenides (e.g., metalloid sulfides, metalloid selenides, metalloid tellurides, etc.). In some cases, the nanopositor or nanopositor support may comprise a metal and/or metalloid carbide, nitride, phosphide, silicide, or combination of these. Examples of metal atoms in a non-zero oxidation state which may be particularly suitable, in some embodiments, for use in nanopositors or nanopositor supports include, but are not limited to, oxide and chalcogenide forms of zirconium, hafnium, tantalum, niobium, yttrium, lanthanum, molybdenum, lanthanide metals, titanium, aluminum, rhenium, and calcium, among others. Examples of metalloid atoms in a non-zero oxidation state which may be particularly suitable, in some embodiments, for use in nanopositors or nanopositor supports include, but are not limited to, silicon and germanium among others. Specific examples of suitable nanopositors include, but are not limited to, zirconia, doped zirconia, titania, doped titania (e.g., Sn-doped titania), $MoO_3/ZrO_2$ blends, FeS, and $Si_3N_4$.

In some instances, the nanopositor may comprise nanoparticles. Generally, the term "nanoparticle" is used to refer to any particle having a maximum cross-sectional dimension of less than about 1 micrometer. In some embodiments, a nanopositor nanoparticle may have a maximum cross-sectional dimension of less than about 500 nm, less than about 250 nm, less than about 100 nm, less than about 10 nm, less than about 5 nm, less than about 3 nm, less than about 2 nm, less than about 1 nm, between about 0.3 and about 10 nm, between about 10 nm and about 100 nm, or between about 100 nm and about 1 micrometer. A plurality of nanopositor nanoparticles may, in some cases, have an average maximum cross-sectional dimension of less than about 1 micrometer, less than about 100 nm, less than about 10 nm, less than about 5 nm, less than about 3 nm, less than about 2 nm, less than about 1 nm, between about 0.3 and about 10 nm, between about 10 nm and about 100 nm, or between about 100 nm and about 1 micrometer. As used herein, the "maximum cross-sectional dimension" refers to the largest distance between two opposed boundaries of an individual structure that may be measured. The "average maximum cross-sectional dimension" of a plurality of structures refers to the number average.

In some cases, the nanopositor may comprise one or more nanoscale features. As used herein, a "nanoscale feature" refers to a feature, such as a protrusion, groove or indentation, particle, or other measurable geometric feature on an article that has at least one cross-sectional dimension of less than about 1 micrometer. In some cases, the nanoscale feature may have at least one cross-sectional dimension of less than about 500 nm, less than about 250 nm, less than about 100 nm, less than about 10 nm, less than about 5 nm, less than about 3 nm, less than about 2 nm, less than about 1 nm, between about 0.3 and about 10 nm, between about 10 nm and about 100 nm, or between about 100 nm and about 1 micrometer. Not wishing to be bound by any theory, the nanoscale feature may increase the rate at which a reaction, nucleation step, or other process involved in the formation of a nanostructure occurs. Nanoscale features can be formed, for example, by roughening the surface of a nanopositor.

Additional suitable nanopositor materials and configurations are described, for example, in U.S. Patent Application Publication No. 2011/0027162, filed Jul. 30, 2010, and published Feb. 3, 2011, entitled "Systems and Methods Related to the Formation of Carbon-Based Nanostructures," to Steiner, III et al, which is incorporated herein by reference in its entirety for all purposes.

It should be understood that when a portion (e.g., layer, structure, region) is "on", "adjacent", "above", "over", "overlying", or "supported by" another portion, it can be directly on the portion, or an intervening portion (e.g., layer, structure, region) also may be present. Similarly, when a portion is "below" or "underneath" another portion, it can be directly below the portion, or an intervening portion (e.g., layer, structure, region) also may be present. A portion that is "directly on", "immediately adjacent", "in contact with", or "directly supported by" another portion means that no intervening portion is present. It should also be understood that when a portion is referred to as being "on", "above", "adjacent", "over", "overlying", "in contact with", "below", or "supported by" another portion, it may cover the entire portion or a part of the portion.

As noted above, in some embodiments, a nanostructure precursor (e.g., a carbon-based nanostructure precursor) can be exposed to a nanopositor under conditions causing the formation of nanostructures (e.g., carbon-based nanostructures), for example on the nanopositor. Exposure to such conditions may comprise, for example, exposure to a particular temperature, pH, solvent, chemical reagent, type of atmosphere (e.g., nitrogen, argon, oxygen, etc.), electromagnetic radiation, or the like. In some cases, the conditions may be selected to facilitate nucleation, growth, stabilization, removal, and/or other processing of nanostructures. In some cases, the conditions may be selected to facilitate reactivation, removal, and/or replacement of the nanopositor. In some cases, the conditions may be selected to maintain the activity of the nanopositor. Some embodiments may comprise a set of conditions comprising exposure to a source of external energy. The source of energy may comprise electromagnetic radiation, electrical energy, sound energy, thermal energy, or chemical energy. For example, the conditions can comprise exposure to heat or electromagnetic radiation, resistive heating, exposure to a laser, or exposure to infrared light. In some embodiments, the set of conditions comprises exposure to a particular temperature, pressure, chemical species, and/or nanostructure precursor material. For example, in some cases, exposure to a set of conditions comprises exposure to substantially atmospheric pressure (i.e., about 1 atm or 760 torr). In some cases, exposure to a set of conditions comprises exposure to a pressure of less than about 1 atm (e.g., less than about 100 torr, less than about 10 torr, less than about 1 torr, less than about 0.1 torr, less than about 0.01 torr, or lower). In some cases, the use of high pressure may be advantageous. For example, in some embodiments, the conditions comprise exposure to a pressure of at least about 2 atm, at least about 5 atm, at least about 10 atm, at least about 25 atm, or at least about 50 atm. In some instances, the set of conditions comprises exposure to a temperature below about 600° C., below about 500° C., or below about 400° C. (and, in some cases, above about 300° C.).

In some embodiments, exposure to growth conditions comprises performing chemical vapor deposition (CVD) of nanostructures on the nanopositor. In some embodiments, the chemical vapor deposition process may comprise a plasma chemical vapor deposition process. Chemical vapor deposition is a process known to those of ordinary skill in the art, and is explained, for example, in Dresselhaus M S, Dresselhaus G., and Avouris, P. eds. "Carbon Nanotubes: Synthesis, Structure, Properties, and Applications" (2001) Springer, which is incorporated herein by reference in its entirety.

The following patents and patent applications are incorporated herein by reference in their entireties for all purposes: International Patent Application Serial No. PCT/US2007/011914, filed May 18, 2007, entitled "Continuous Process for the Production of Nanostructures Including Nanotubes," published as WO 2007/136755 on Nov. 29, 2007; U.S. patent application Ser. No. 12/227,516, filed Nov. 19, 2008, entitled "Continuous Process for the Production of Nanostructures Including Nanotubes," published as US 2009/0311166 on Dec. 17, 2009; International Patent Application Serial No. PCT/US07/11913, filed May 18, 2007, entitled "Nanostructure-reinforced Composite Articles and Methods," published as WO 2008/054541 on May 8, 2008; International Patent Application Serial No. PCT/US2008/009996, filed Aug. 22, 2008, entitled "Nanostructure-reinforced Composite Articles and Methods," published as WO 2009/029218 on Mar. 5, 2009; U.S. patent application Ser. No. 11/895,621, filed Aug. 24, 2007, entitled "Nanostructure-Reinforced Composite Articles and Methods," published as US 2008/0075954 on Mar. 27, 2008; U.S. Pat. No. 7,537,825, issued on May 26, 2009, entitled "Nano-Engineered Material Architectures: Ultra-Tough Hybrid Nanocomposite System"; U.S. patent application Ser. No. 11/895,621, filed Aug. 24, 2007, entitled "Nanostructure-Reinforced Composite Articles," published as U.S. Patent Application Publication No. 2008/0075954 on Mar. 27, 2008; U.S. Provisional Patent Application 61/114,967, filed Nov. 14, 2008, entitled "Controlled-Orientation Films and Nanocomposites Including Nanotubes or Other Nanostructures"; U.S. patent application Ser. No. 12/618,203, filed Nov. 13, 2009, entitled "Controlled-Orientation Films and Nanocomposites Including Nanotubes or Other Nanostructures," published as U.S. Patent Application Publication No. 2010/0196695 on Aug. 5, 2010; U.S. patent application Ser. No. 12/630,289, filed Dec. 3, 2009, entitled "Multifunctional Composites Based on Coated Nanostructures," published as U.S. Patent Application Publication No. 2010/0255303 on Oct. 7, 2010; U.S. patent application Ser. No. 12/847,905, filed Jul. 30, 2010, entitled "Systems and Methods Related to the Formation of Carbon-Based Nanostructures"; U.S. Provisional Patent Application No. 61/264,506, filed Nov. 25, 2009, and entitled "Systems and Methods for Enhancing Growth of Carbon-Based Nanostructures"; U.S. patent application Ser. No. 12/953,287, filed Nov. 23, 2010, entitled "Systems and Methods for Enhancing Growth of Carbon-Based Nanostructures"; and U.S. Provisional Patent Application Ser. No. 61/537,538, filed Sep. 21, 2011, and entitled "Methods for Growth of Nanostructures on Substrates Including Fibers." The articles, systems, and methods described herein may be combined with those described in any of the patents and/or patent applications noted above. All patents and patent applications mentioned herein are incorporated herein by reference in their entirety for all purposes.

The following examples are intended to illustrate certain embodiments of the present invention, but do not exemplify the full scope of the invention.

EXAMPLE 1

This example describes the sol-gel deposition of alumina on carbon fiber substrates and subsequent growth of carbon nanotubes. The carbon fibers used in these examples were taken from unsized (i.e., never-sized) intermediate-modulus (high-tensile-strength) carbon fiber tows obtained from industrial supplier TohoTenax ("fiber HTR-40") and a standard AS4 fiber ("fiber AS4"). The unsized fibers described in these examples are not normally commercially available, but rather, were spooled from their respective production lines prior to the surface oxygenation and sizing steps typically performed in their manufacture.

The sol-gel deposition of alumina via propylene-oxide-assisted gelation was investigated. In this process, 2.96 g of aluminum chloride hexahydrate ($AlCl_3 \cdot 6H_2O$, Sigma-Aldrich product number 237078, 99%) was dissolved in a mixture of 20.0 g (20.0 mL) deionized water (analytical reagent grade deionized water, Ricca Chemical Company product number 9150-1) and 20.0 g (25.4 mL) 2-propanol (isopropanol, Mallinckdrodt Chemicals product number 3032-16, ACS grade). The mixture was stirred until the salt had fully dissolved. Next, 7.86 g (9.5 mL) propylene oxide ($C_3H_5O$, Sigma-Aldrich product number 110205, 99%, or 82320, ≥99.5%) was added slowly into the solution via syringe with stirring. The solution was then stirred another 5 min and allowed to solidify. Gel time was about 4 h.

Alternatively, a solution of 10.0 g (10.0 mL) deionized water and 7.89 g (10.0 mL) absolute ethanol (anhydrous absolute ethanol, $C_2H_5OH$, Pharmco-Aaper product number 111000200, ACS/USP grade) could be used. In this case the gel time was reduced to about 1 hour and 40 min. Gel time could be further adjusted for either of these processes by increasing the amount of solvent used. However, doing so also resulted in an increase in porosity.

The sol-gel deposition of alumina via epichlorohydrin-assisted gelation was also investigated. A solution of 15.78 g (20.0 mL) ethanol and 4.52 g (4.52 mL) $H_2O$ was prepared. 2.96 g $AlCl_3 \cdot H_2O$ was then added to the solution, with stirring. With this solution placed on a balance, 12.52 g (10.58 mL) epichlorohydrin ($C_3H_5OCl$, Sigma-Aldrich product number 240699, ≥99%) was added slowly by a syringe with an 18-gage needle (at a rate of a few drops per second). The solution was then stirred for another 5 min. Gel time was approximately 120 min. The density of the gel could be lowered by adding more ethanol. At least the amount of water specified here was required to dissolve all of the $AlCl_3$. However if water was added until the solution was greater than 30-40% water by volume, the epichlorohydrin separated into a second phase and no gelation occurred. Similarly, when using barely enough ethanol to get the solution into a single phase, the solution often spontaneously became hazy and epichlorohydrin separated out due to evaporation of the ethanol.

Unsized (i.e., never-sized), never-surface-treated carbon fiber tow (TohoTenax product number HTR40 N00 24k 1550tex) was used for substrates. As noted above, this product is not generally available commercially. The equivalent commercial version, HTA40 F22 24k 1550tex, is surface-treated and sized. Carbon fiber tows (about 10 cm long) were cut and taped at one end with masking tape (3M 2600) for ease of handling. Tows were soaked in freshly-mixed alumina sol and removed at fixed time intervals: for 45-min gel times, samples were removed at 15 min, 30 min, and right at gelation; for 4-h gel times, samples were removed at 1 h, 2 h, and right before gelation; for 120-min gel times, samples were removed at 30 min, 1 h, and right at gelation. Next, a screw-top Erlenmeyer flask containing just enough 2-propanol or ethanol (the same solvent used in the sol-gel process) was used to provide a pool about 1-cm deep at the bottom. Samples were then taped to the top of the screw-top cap for the flask and screwed into place. This provided a solvent-saturated atmosphere to allow sol coating on the fibers to gel without drying out. Once the gel point had been reached, samples were optionally soaked under 2-propoanol or ethanol, respectively. This ensured excess water and leftover reactive materials were removed from the pore network to minimize syneresis of the gel coating. Finally, the alumina-gel-coated fibers were optionally hung and allowed to dry in air.

Alumina-coated fibers were then dip-coated with 0.050 M $Fe(NO_3)_3 \cdot 9H_2O$ in 2 propanol ($Fe^{3+}$/IPA). Some alumina-coated fibers were dip-coated before the coating was dry, others were dip-coated after it was dry. After they were dip-coated with catalyst solution, fibers were hung and allowed to air dry. Once the tow was dry and ready for further processing, the taped end was cut off.

To determine the efficacy of the alumina coating for growing CNTs, the tow was CVD processed for CNT growth. CVD growth of CNTs was performed in a fused quartz tube (54-mm outer diameter, 50-mm inner diameter, 137-cm length) heated by a three-zone split-hinge tube furnace (Lindberg/Blue M model HT55667C, 30-cm heated zone lengths). In a typical process, specimens were placed in a fused quartz process tube at the center of the third zone. The tube was then flushed with a flow of 2070 sccm He for 10 min to displace oxygen from the tube. Next, He was turned off and a flow of 1040 sccm $H_2$ gas (Airgas, ultrahigh purity grade, >99.999%) was introduced. The sample was then heated to 720° C.-730° C. under $H_2$ gas over the course of about 8 min to reduce iron oxide nanoparticles on the specimen to catalytically-active iron. The sample remained at these conditions for an additional 7 min to further reduce remaining iron oxide nanoparticles. A flow of 316 sccm ethylene (Airgas, ultrahigh purity grade, >99.999%) was then added for 5 min to facilitate CNT growth. Lastly, $H_2$ and $C_2H_4$ were turned off and the sample was allowed to cool to room temperature under a flow of 2070 sccm He.

Figure 5:
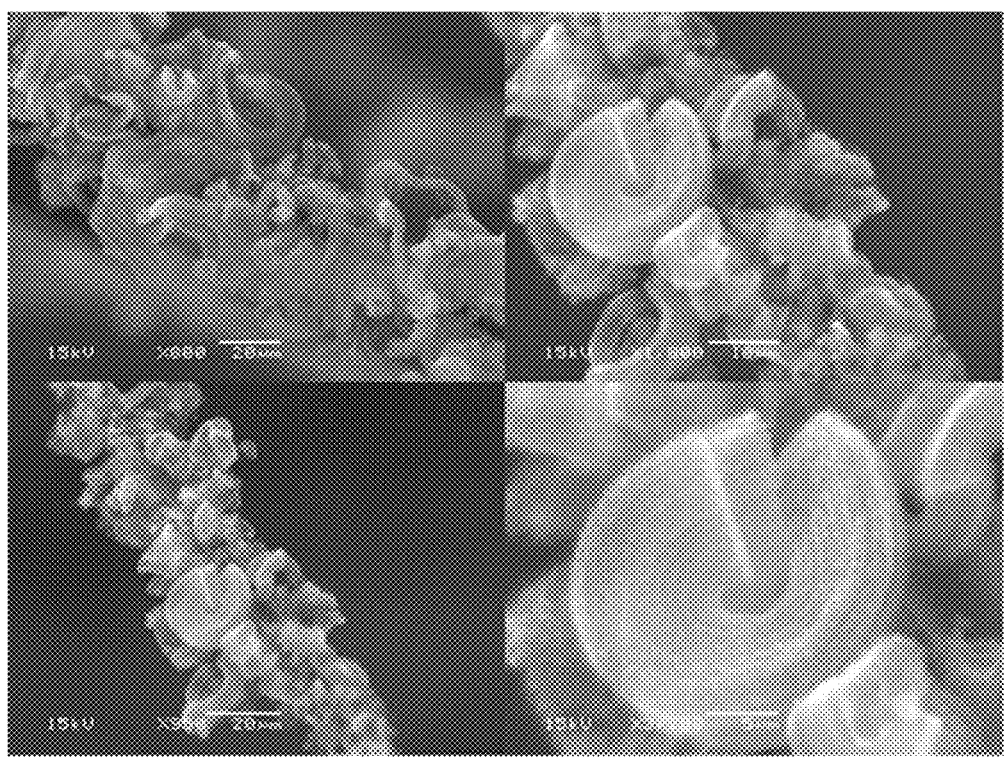
FIG. 5 includes SEM images of carbon nanotubes grown on carbon fibers coated with alumina, according to one set of embodiments.

A high yield of bundles of aligned CNTs was observed over the surface of the fibers, as illustrated in FIG. 5. Generally, carbon nanotube growth was observed where alumina was present on the carbon fibers. While SEM imaging of the alumina coatings showed that chunks of alumina were clinging to the fibers (believed to be due to the alumina losing a substantial amount of volume on drying), it is believed that conformal coatings of alumina could be achieved by using multiple depositions to build up a contiguous film (e.g., by employing multiple coatings of sol, followed by low-temperature annealing). Alternatively, the alumina coating can be improved by depositing an intermediate polymeric layer between the alumina and the carbon fiber, as described below in Example 4.

EXAMPLE 2

This example describes a sol-gel process for producing silica coatings on carbon fibers. A rapid gelation process was developed and evaluated as a means for coating carbon fibers with a porous gel coating in less than one minute. The resulting silica coating was then investigated for its ability to adhere to carbon fibers and promote aligned CNT growth.

A solution containing 5.17 g Tetramethoxysilane (TMOS, Sigma-Aldrich product number 218472, 98%) and 3.97 g anhydrous absolute ethanol (Pharmco-Aaper product number 111000200, 200-proof) and a second solution containing 2.00 g $NaOH_{(aq)}$ stock solution (19.1 mg/mL), 2.00 g $NaF_{(aq)}$ stock solution (1 mg/mL), and 2.36 g ethanol were prepared. The salt solution was then added to the alkoxide solution and swirled vigorously. Gel time was about 17 sec. Fibers were coated by quickly dipcoating within this time period or alternatively by pouring the gelling sol over a tow placed on aluminum foil.

Following application of the gel coating, the gel-coated tow was soaked in ethanol for 1-4 h to remove unreacted materials from the pore network. The tow was then air-dried, dip-coated with $Fe^{3+}$/IPA, and CVD processed for CNT growth as described in Example 1.

Figure 6:
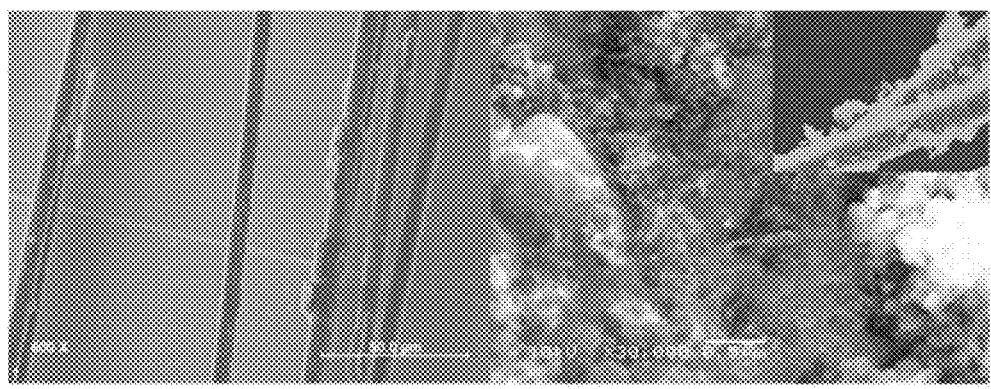
FIG. 6 includes, according to some embodiments, SEM images of sol-gel derived silica coatings on carbon fibers.

FIG. 6 shows SEM images of carbon fibers coated with sol-gel-derived silica before (left) and after (right) CNT growth. The inset of the right image in FIG. 6 illustrates the silica/CNT coverage over the carbon fiber substrate. While cracking in the silica coating was observed, it is believed that more conformal coatings could be achieved by repeating the coating process multiple times. Alternatively, the silica coating can be improved by depositing an intermediate polymeric layer between the silica and the carbon fiber, as described below in Example 4.

EXAMPLE 3

This example describes the chemical vapor deposition (CVD) of alumina on carbon fiber substrates using a solid-phase aluminum triisopropoxide (ATI) precursor in a hot-wall reactor.

Aluminum triisopropoxide (ATI, ≥98%, Sigma-Aldrich product number 220418) served as the alumina precursor and was used as received. An alumina ceramic crucible (Sigma-Aldrich part number Z561738) was used to contain the ATI. Between 0.5-1.0 g of new ATI was placed in the crucible prior to each deposition. CVD of alumina was performed in a fused quartz tube (54-mm outer diameter, 50-mm inner diameter, 137-cm length) heated by a three-zone split-hinge tube furnace (Lindberg/Blue M model HT55667C, 30-cm heated zone lengths). Positions of objects in the quartz tube are referred herein by the zone number in which the object was placed (wherein "Zone 1" is the zone on the side of the reactor in which gases enter, "Zone 2" is the center zone, and "Zone 3" is the zone on the side in which effluent exits) followed by the position in the zone in which it was placed ("Left" for the side of the zone towards gas entry, "Center" for the center, and "Right" for the side of the zone towards effluent exit). Samples placed at positions straddling two zones are denoted by "Zone X-Zone Y Boundary," where X and Y are the respective zone numbers associated with the boundary.

The crucible containing ATI was placed in the center of the first zone ("Zone 1 Center") in order to facilitate control over the precursor temperature. Helium (Airgas, ultrahigh purity grade, >99.999%) was used as a carrier gas and was delivered via a computer-controlled mass flow controller (Unit model 1100A, 10 SLM capacity). Although many alumina CVD processes are conducted at reduced pressure, depositions in this work were performed at atmospheric pressure to improve potential compatibility for eventual integration with continuous CNT growth on carbon fiber substrates. Target substrates were unsized carbon fiber tow (TohoTenax, product number HTA40 N00 12K, formerly 12 KHTA-7CNS01) cut to 6.5-cm lengths tied into knots at either end, and desized carbon fiber weave (Tenax-J G40-800 24K EP03) cut to sizes of either 4 cm×18 cm or 4 cm×6 cm. Weaves were received sized and desized by baking in air at 200° C. for 30 min prior to deposition. Successful desizing was indicated by the evolution of smoke from the weave during the first 5 min of the heat treatment. Successful deposition of alumina on tows and weaves was determined by the presence of a colored thin film observable by optical microscopy at 50× magnification or below and confirmed by SEM.

A low precursor set point of 150° C.-230° C. (slightly above the melting point of ATI) and a substrate set point of 700° C.-780° C. were used. Additionally, three substrates (unsized tows) were positioned across the length of the second zone to assess spatial-dependence of the deposition. Due to proximity heating from the second zone, the zone containing the precursor was observed to be much hotter than its set point (ramping from 370° C. to 495° C. over the course of the 10-min soak phase of the deposition). Despite this, successful deposition of alumina was observed over most of the length of the first tow (positioned at Zone 2 Left) and was visible under a microscope and to the eye as a glossy rainbow-colored glaze. The coatings appeared well-adhered and, as observed by SEM, did not appear to crack or substantially flake off on handling of the tow. The tows positioned at Zone 2 Center and Zone 2 Right, however, did not show the presence of an alumina film, revealing the presence of a limited region (up to about 12 cm downwind of the crucible) in which deposition can be performed. The absence of white or glossy deposits on the quartz tube in Zone 2 suggests that formation of the observed deposit was surface-reaction-limited.

The successfully-coated specimen and an uncoated control specimen were then dip-coated with $Fe^{3+}$/IPA and CVD processed for CNT growth. First, a catalyst solution of 0.050 M $Fe(NO_3)_3 \cdot 9H_2O$ in 2-propanol (IPA) was prepared and aged with stirring for 1-2 h. Specimens were then dipped into this solution ($Fe^{3+}$/IPA) for about 5 min and then hung to air dry. Using the same CVD equipment used for alumina deposition described above, specimens were placed into a dedicated quartz process tube at Zone 3 Center. The tube was then flushed with a flow of 2070 sccm He for 10 min to displace oxygen from the tube. Next, He was turned off and a flow of 1040 sccm $H_2$ gas (Airgas, ultrahigh purity grade, >99.999%) was introduced. The sample was then heated to 650° C. under $H_2$ gas over the course of about 8 min to reduce iron oxide nanoparticles on the specimen to catalytically-active iron. The sample remained at these conditions for an additional 7 min to further reduce remaining iron oxide nanoparticles. A flow of 316 sccm ethylene (Airgas, ultrahigh purity grade, >99.999%) was then added for 5 min to facilitate CNT growth. Lastly, $H_2$ and $C_2H_4$ were turned off and the sample was allowed to cool to room temperature under a flow of 2070 sccm He.

Figure 7:
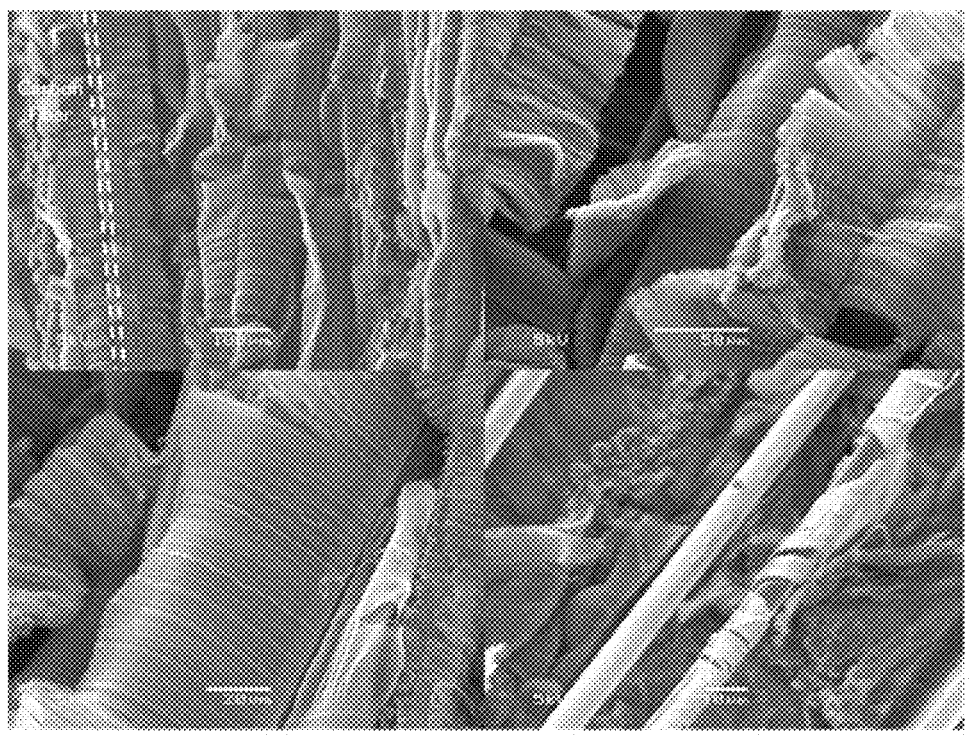
FIG. 7 includes SEM images of aligned carbon nanotubes grown on alumina coated carbon fibers, according to certain embodiments.

Following CNT growth processing the alumina-coated sample was noticeably fuzzy and matte black in color, while the control sample remained smooth and glossy black. SEM imaging of the CNT-processed samples, shown in FIG. 7, revealed extremely high-yield growth of aligned CNTs covering the alumina-coated tow over nearly the entire length of the tow including interior fibers. The top left, top right, and lower left images in FIG. 7 are SEM images of aligned CNTs grown on the alumina-coated carbon fibers. The lower right image in FIG. 7 shows the alumina-wrapped carbon fibers after the mechanical delamination of the CNTs.

EXAMPLE 4

In this example, methods of non-covalently functionalizing carbon fibers with amphiphilic polymers derived from poly(styrene-alt-[maleic anhydride]) (PSMA) is described. The use of h-PSMA as a non-covalent functionalizing polymer and its potassium salt (K-PSMA) as a polyelectrolyte for ion exchange were investigated as methods for improving adhesion of sol-gel-derived alumina coatings and solution-deposited iron catalyst precursors to carbon fibers. These methods were then investigated for efficacy in facilitating CNT growth.

Aqueous solutions with varying concentrations of h-PSMA were prepared by dissolving 1.4 g, 4.2 g, or 7.0 g (corresponding to concentrations of 0.5, 1.5, and 2.5 wt %, respectively) of PSMA (Sigma-Aldrich, 99%, Mw=350,000) in 25 mL of acetone with gentle heating. The PSMA solution was then added to 300 mL of 0.3 M NaOH in deionized water with stirring and allowed to react for 3 h, after which it was acidified with 0.1 M $HNO_3$ to a pH of 8. The acetone in the solution was then removed with a rotary evaporator.

Unsized (i.e., never-sized), never-surface-treated carbon fiber tow (TohoTenax product number HTR40N00 24k 1550tex) was used for substrates. As noted elsewhere, the equivalent commercial version of the fibers that were used as substrates is HTA40 F22 24k 1550tex, which is surface-treated and sized. h-PSMA was coated over the fibers by dip-coating a tow in aqueous h-PSMA solution for about 5 min and subsequently allowing the tow to dry in air or blow-drying with cool air (which took about 9 min). Upon removal of the tow from h-PSMA solution, the tow became noticeably stiff and hard to peel apart. To improve coating of fibers in the inner tow, the tow could be dabbed up and down in the h-PSMA solution (as is done to clean a watercolor paintbrush) over the 5-min period.

Auger spectroscopy revealed extensive coverage of a well-adhered conformal h-PSMA coating, disrupted only where fibers had clung together during dip-coating of the h-PSMA due to capillary action.

In this coating process, PSMA was hydrolyzed to produce carboxylate derivatives. Not wishing to be bound by any particular theory, it is believed that phenyl groups extending off of the polymer backbone undergo pi-pi stacking ($\pi$-$\pi$ stacking) with similarly-structured aromatic rings on the surface of the carbon fiber, enabling the carbon fiber surface to be coated by the polymer. Polar carboxylate moieties, also extending off of the polymer backbone, are believed to be then repelled by the carbon fiber surface and provide a polar surface functionality over the fiber. Upon heating under inert atmosphere, it is believed that this polymer results in a carbon coating over the fiber that can potentially protect the underlying fiber from chemical interactions with barrier and catalyst materials.

EXAMPLE 5

In this example, h-PSMA-coated fibers were coated with sol-gel-derived alumina or silica coatings to determine whether the h-PSMA coating could improve the degree to which carbon fibers are coated with alumina and/or silica. The efficacy of h-PSMA for improving adhesion of sol-gel-derived coatings was evaluated using FE-SEM spatial elemental analysis by Auger spectroscopy.

Figure 8:
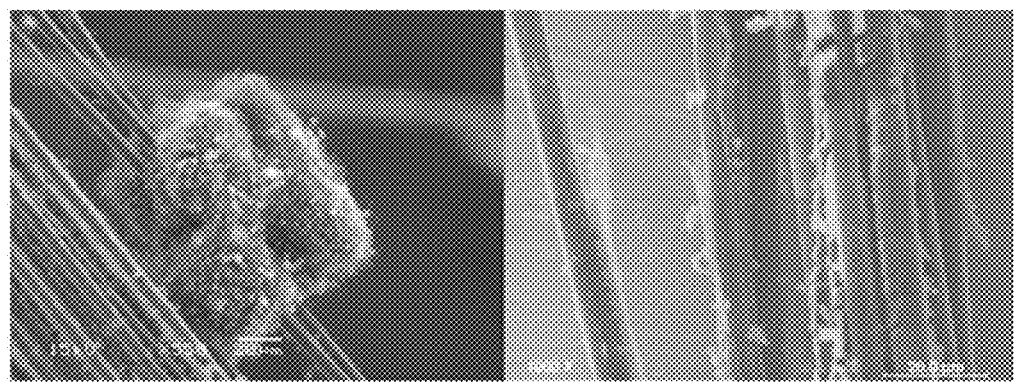
FIG. 8 shows SEM images of carbon nanotubes grown on carbon fibers coated with alumina with and without h-PSMA undercoatings, according to some embodiments.

As discussed in Example 1, sol-gel deposition of alumina can enable high-yield, aligned CNT growth, but, if too few coating steps are employed, can also exhibit poor adhesion and can undergo substantial volume contraction during both the gel aging phase (up to 50%) and upon evaporative drying (up to 90% of the aged gel) thereby leaving substantial areas of bare fiber. FIG. 8 includes SEM images of (left) initially-uncoated carbon fibers covered with alumina deposits produced via the techniques described in Example 1, followed by a dip-coating with $Fe^{3+}$/IPA and subsequent CNT growth by CVD and (right) h-PSMA-coated carbon fibers produced according to the methods in Example 4, subsequently covered with alumina via the methods described in Example 1. Although some cracking was observed over the h-PSMA-coated fibers, the coverage was noticeably improved. It is believed that subsequent coating steps could produce a conformal coating of alumina over the carbon fiber substrates.

Figure 9:
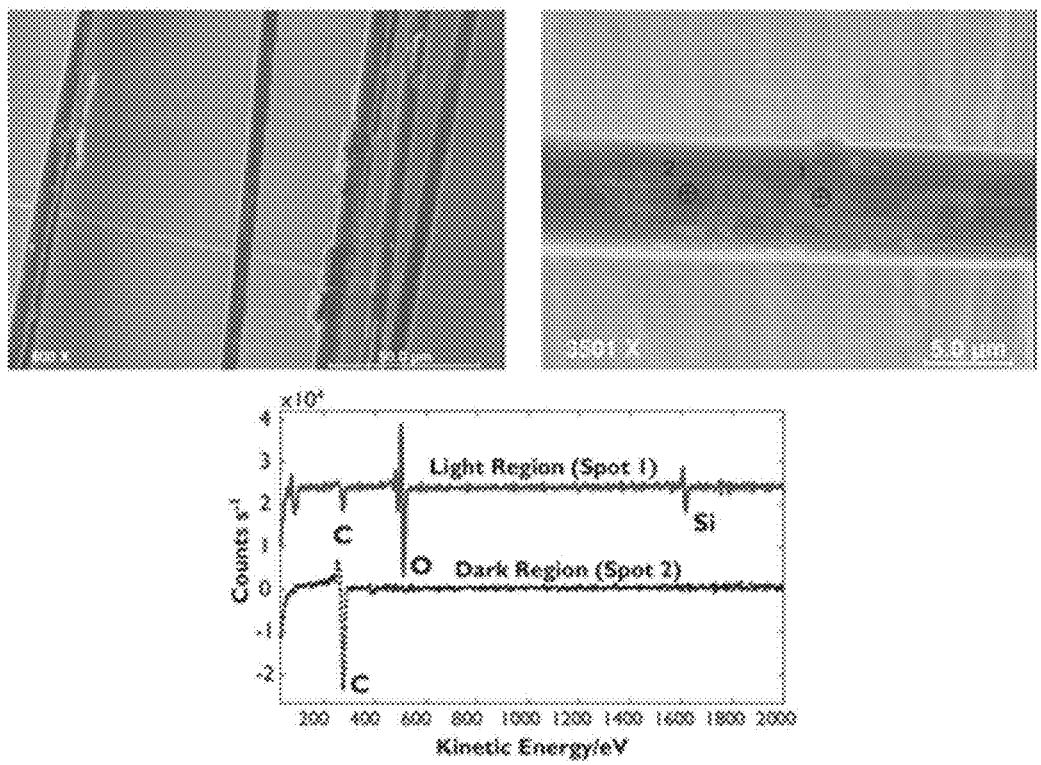
FIG. 9 shows, according to some embodiments, FE-SEM images and an Auger spectrum of a silica coating on a carbon fiber without an h-PSMA underlayer.
Figure 10:
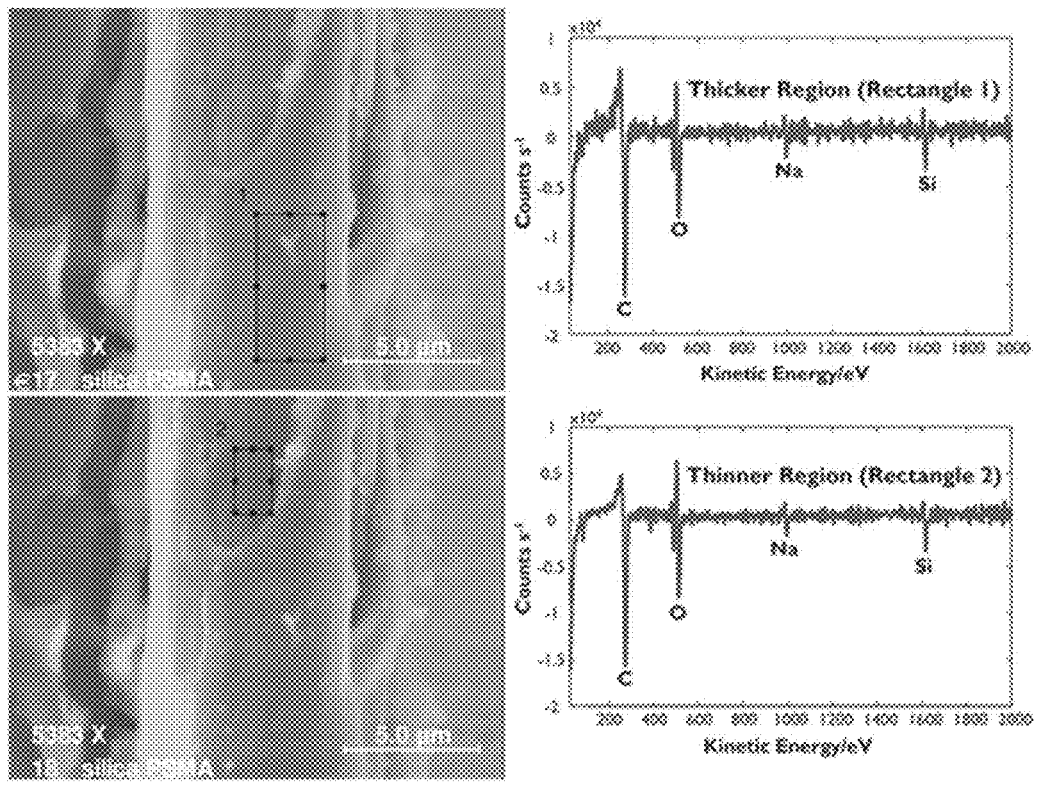
FIG. 10 includes, according to certain embodiments, FE-SEM images and an Auger spectrum of a silica coating on a carbon fiber with an h-PSMA underlayer.

The efficacy of h-PSMA for improving adhesion of silica sol-gel-derived coatings, described in Example 2, was also evaluated. As described in Example 2, silica coatings were deposited from an alkoxide and often resulted in a high degree of mass loss upon evaporative drying. Accordingly, additional experiments were performed in which h-PSMA was formed over the carbon fiber substrates and, subsequently, silica coatings were deposited. Without the h-PSMA coating, unevenly-distributed silica deposits were present over carbon fibers, as shown in FIG. 9. Spatial elemental analysis by Auger spectroscopy (shown on the bottom of FIG. 9) verified that lighter patches on the fiber surface, present as both sporadic thin films and in thick chunks, contained Si and O, whereas the surrounding dark regions only contained C, indicating these dark regions were the uncoated carbon fiber surface. On carbon fibers pre-coated with h-PSMA and subsequently coated with silica, however, a well-adhered coating with somewhat uneven thickness was observed, as shown in FIG. 10. Auger spectroscopy was performed showing the presence of Si and O over the fibers both in thicker deposits and over areas that at first glance seem to be uncoated fiber surfaces (but were actually just thin coatings). The Auger spectra are illustrated on the right side of FIG. 10. These results indicated that pre-deposition of h-PSMA could also improve the adhesion of alkoxide-derived gel coatings, even those that undergo substantial mass loss upon evaporative drying due to their high pore volumes.

EXAMPLE 6

In this example, the development and optimization of a polyelectrolyte comprising poly(styrene-alt-[dipotassium maleate]) (K-PSMA) is described, including its utility for enabling high-yield, CVD growth of CNTs on carbon fiber tows at temperatures below 500° C.

A solution of 1.5 wt % h-PSMA was prepared as described in Example 4. The h-PSMA polyacid was then neutralized by stirring solid $K_2CO_3$ (Sigma-Aldrich part number 209619, >99.0%) into the solution. At first, the $K_2CO_3$ simply dissolved in the solution, but upon further addition, evolution of a $CO_2$ fizz resulted. $K_2CO_3$ was added until $CO_2$ fizz no longer resulted upon further addition. This point corresponded to a solution pH of about 11 (i.e., about 0.79 g $K_2CO_3$/10.00 g 1.5 wt % h-PSMA solution).

Unsized (i.e., never-sized), never-surface-treated carbon fiber tow (TohoTenax product number HTR40N00 24k 1550tex) was used for substrates. Carbon fiber tows (about 10 cm long) were cut and taped at one end with masking tape (3M 2600) for ease of handling. K-PSMA was coated over the fibers by dip-coating a tow in aqueous K-PSMA solution for about 5 min and subsequently allowing the tow to dry in air or blow-drying with cool air (which took about 9 min). Upon removal of the tow from K-PSMA solution the tow became noticeably stiff and hard to peel apart, but less so than when coating with h-PSMA. To improve coating of fibers in the inner tow, the tow could be dabbed up and down in the h-PSMA solution (as is done to clean a watercolor paintbrush) over the 5-min period.

K-PSMA-coated fibers were then dip-coated with iron catalyst precursor solutions. 0.050 M $Fe(NO_3)_3 \cdot 9H_2O$ in 2-propanol ($Fe^{3+}$/IPA) was used. In subsets of these formulations, the $Fe^{3+}$/IPA solution was aged for 30 min, 60 min, and 90 min prior to dip-coating. Some K-PSMA-coated fibers were dip-coated before the K-PSMA deposit was dry, others were dip-coated after it was dry. Alternatively, 0.1 M aqueous $Fe(NO_3)_3$ was used to dip-coat catalyst precursor. The results outlined below were made by dipcoating with the $Fe^{3+}$/IPA solution aged for 60 min and dipcoating after the K-PSMA coating was dry. After dip-coating with catalyst, the masking tape at the end of the tow was cut off. At this point, the tow was sufficiently stiff from and held together by its K-PSMA coating that handling of the fibers was possible without tape.

The $Fe^{3+}$/K-PSMA-coated fibers were then CVD processed in a hot-wall configuration for CNT growth. Samples were placed in a dedicated fused quartz process tube (25-mm outer diameter×22-mm inner diameter×30-cm length) and heated in an electric clam-shell tube furnace (Lindberg/Blue M MiniMite). Samples were positioned at 75% along the length of the heated zone. First, a flow of 750 sccm Ar (Airgas, ultrahigh purity grade, >99.999%) was introduced into the reactor for 2 min to displace oxygen from the process tube. Next, a flow of 400 sccm $H_2$ (Airgas, ultrahigh purity grade, >99.999%) was added and the Ar flow lowered to 200 sccm Ar. The samples were then heated to a set point temperature of 480° C. under $H_2$/Ar flow to reduce and coarsen iron ions adsorbed over the coated fiber surfaces to iron nanoparticles. Once at this temperature, a flow 17 sccm $CO_2$ (Airgas, ultrahigh purity grade, >99.999%) and 167 sccm 10% $C_2H_2$ in Ar (Airgas, ultrahigh purity grade, >99.999%, acetone-free) were introduced and the $H_2$ and Ar deactivated. The samples were soaked under these conditions for 15 min after which a flow of 750 sccm Ar was introduced and the $CO_2$ and $C_2H_2$/Ar mixture were deactivated. The furnace was then opened and the samples were allowed to cool to ambient conditions. Between CNT growths, the quartz process tube was baked in air at 750° C. for about 20 min to remove deposited organics. In one variation of this process, samples were not treated with $H_2$ on ramp-up to the set point temperature.

Figure 11:
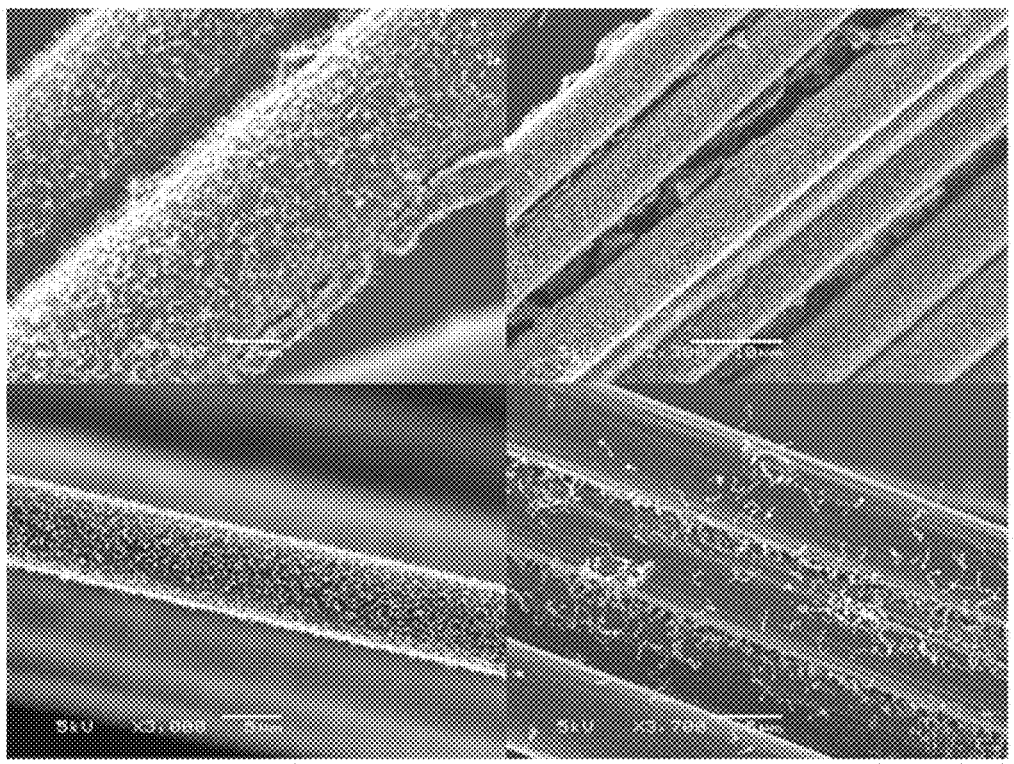
FIG. 11 shows SEM images of carbon nanotubes grown on carbon fibers with a K-PSMA coating, according to some embodiments.

FIG. 11 shows SEM images showing the growth of CNTs on the K-PSMA coated fibers. The top left image shows a representative fiber covered with unaligned CNTs. The top right image shows an overview of fuzzy fibers in a tow. The bottom left image shows the detail of a single fuzzy fiber. The bottom right image shows sparser growth that was observed in a few fibers.

Short (1-3 µm), unaligned CNTs were observed in a significant quantity (about 6-8 CNTs/µm$^2$) over the majority of fibers in the tow (where the fibers successfully engaged the coating solutions). As a control, an unsized tow without K-PSMA was coated with iron catalyst precursor by baking on Fe$^{3+}$/IPA solution and processed with the same CVD procedure. No CNTs were observed on this tow; instead, platelets of iron presenting an observable grain structure were found delaminating from the fibers. This example demonstrates that CNT growth on carbon fibers can be achieved at 480° C. without etching or chemically changing the carbon fiber surface and using only solution-based methods to apply coatings and catalyst precursor.

EXAMPLE 7

In this example, carbon fibers were heated to relatively high temperatures in the absence of applied tension, and their post-heating tensile strengths were measured. The carbon fibers used in this example were primarily unsized, never-surface-treated TohoTenax HTR40-24k. Unsized AS4 fibers were also used in a few studies, as noted.

The cross-sectional diameters of the fibers were generally about 7 micrometers. Unsized fiber was chosen in order to eliminate possible fiber damage associated with desizing procedures such as thermally decomposing the sizing under inert atmosphere or interaction of the fiber with unremoved sizing.

Prior to use, the carbon fibers were rinsed with acetone and evaporatively dried in air. Single fibers were carefully extracted from the 24k tow using Q-Tips®, which gently latched onto the fibers and pulled them out from the other fibers. Care was taken not to stretch fibers when pulling them out to avoid pretensioning of the fiber. It should be noted that the force required to break a single carbon fiber was about 40-180 mN, or about 0.01-0.04 lb$_f$, corresponding to a stretch of only about 150-300 µm.

After pre-processing, thermal process was performed, in which the carbon fibers were heated to a range of temperatures. In the thermal processing step, unstrained carbon fibers were heated to various temperatures in the absence of CVD gases C$_2$H$_4$ and H$_2$. Table 1 includes a summary of single-fiber tensile test data for carbon fibers thermally processed in He atmosphere as a function of temperature and time.

TABLE 1

Summary of single-fiber tensile test data for carbon fibers thermally processed in He atmosphere as a function of temperature and time.

| Sample Description | Processed as | No. of Samples | $\bar{\sigma}$/ GPa (= β) | S($\bar{\sigma}$)/ GPa | Weibull Modulus α | $\bar{E}$/ GPa | S($\bar{E}$)/ GPa |
|---|---|---|---|---|---|---|---|
| Temperature Study, TohoTenax HTR-40 ||||||||
| Unsized HTR-40 | Tow | 19 | 4.49 | 0.75 | 5.96 | 223 | 7.88 |
| Unsized HTR-40, 480° C. in He, 10 min at set point | Tow | 19 | 4.37 | 0.83 | 5.27 | 213 | 12.9 |
| Unsized HTR-40, 580° C. in He, 10 min at set point | Tow | 18 | 2.50 | 0.34 | 7.42 | 211 | 11.9 |
| Unsized HTR-40, 730° C. in He, 10 min at set point | Tow | 20 | 1.47 | 0.28 | 5.30 | 194 | 13.1 |
| Temperature Study, AS4 ||||||||
| Unsized AS4 | Tow | 19 | 3.77 | 0.46 | 8.11 | 237 | 10.2 |
| Unsized AS4, 480° C. in He, 18 min ≥ 480° C. | Tow | 17 | 3.55 | 0.66 | 5.34 | 239 | 9.99 |
| Unsized AS4, 580° C. in He, 18 min ≥ 480° C. | Tow | 20 | 3.74 | 0.69 | 5.40 | 234 | 13.3 |
| Unsized AS4, 730° C. in He, 18 min ≥ 480° C. | Tow | 18 | 1.09 | 0.20 | 5.41 | 215 | 10.2 |
| Temperature vs. Time Study ||||||||
| Unsized HTR-40, 480° C. in He, 18 min ≥ 480° C. | Tow | 20 | 4.49 | 0.94 | 4.76 | 217 | 7.54 |
| Unsized HTR-40, 580° C. in He, 18 min ≥ 480° C. | Tow | 20 | 3.56 | 0.36 | 9.97 | 212 | 8.96 |
| Unsized HTR-40, 730° C. in He, 18 min ≥ 480° C. | Tow | 20 | 3.09 | 0.52 | 5.94 | 205 | 14.0 |
| Unsized HTR-40, 480° C. in He, 36 min ≥ 480° C. | Tow | 20 | 4.20 | 0.95 | 4.44 | 212 | 12.6 |
| Unsized HTR-40, 580° C. in He, 36 min ≥ 480° C. | Tow | 19 | 2.61 | 0.43 | 6.11 | 200 | 13.3 |

TABLE 1-continued

Summary of single-fiber tensile test data for carbon fibers thermally processed in He atmosphere as a function of temperature and time.

| Sample Description | Processed as | No. of Samples | $\bar{\sigma}$/ GPa (= β) | $S(\bar{\sigma})$/ GPa | Weibull Modulus α | $\bar{E}$/ GPa | $S(\bar{E})$/ GPa |
|---|---|---|---|---|---|---|---|
| Unsized HTR-40, 730° C. in He, 36 min ≥ 480° C. | Tow | 18 | 1.94 | 0.63 | 3.07 | 192 | 12.2 |

After thermal processing was performed, single-fiber tensile tests were performed in a universal testing machine (Nano-UTM, MTS Nano Instruments) according to the ASTM standard test D3379-75 ("Standard Test Method for Tensile Strength and Young's Modulus for High-Modulus Single-Filament Materials," 1989), which is incorporated herein by reference in its entirety for all purposes. A baseline data set for as-received fibers was established each day that tensile tests were run to normalize variations arising from machine alignment and variations in materials properties along the tow spool. As an extra validation step, conclusions regarding a sample type were drawn based on differentials run against their respective baseline dataset.

To prepare the fiber samples for testing, testing tabs were laser-cut from tagboard to dimensions specified by ASTM standard test D3379-75. Fibers were mounted on tagboard frames with epoxy. A gage length of 25 mm was used for all samples. First, a straight line was drawn down the center of the tagboard testing frame. A length of carbon fiber tow was cut and laid out on a smooth surface such as clean white copy paper. With gloved fingers, the ends of the tow were spread slightly apart. A fiber grabber tool was used to gently stick onto single carbon fibers in the bundle and pull them away from the tow as described above. The fiber grabber was used to draw a fiber over the line drawn on the testing frame. One end of the fiber was then taped down in this position on the testing frame. A second fiber grabber was then used to pull the fiber taught at other end. This end of the fiber was then taped down. Finally, each end of the fiber was glued in placed with dabs of 5-min epoxy (Devcon, product number 14250) applied by Q-Tip.

Tensile testing was performed as follows. Fiber specimens were first mounted in the testing machine. Proper vertical alignment of the tagboard frame was important to ensure accurate and repeatable tensile measurements. Tabs were gripped on the tagboard 25 mm away from the fiber-epoxy joints. Once mounted in the machine, the sides of the tagboard frame were separated into top and bottom halves by snipping twice on each side as to remove a section of tagboard—this ensured the top and bottom halves did not catch on each other during pulling and introduce a spike or offset in the force-displacement curve measured for the fiber from incorrect autotaring by the instrument software. Fibers were pulled at a strain rate of 400 µstrain/s which ensured no test took longer than 60 s to complete. A nominal fiber diameter of 7 µm was used for stress calculations, which was verified by SEM to be a consistent and reasonable value. Fibers typically broke at a load of about 40-180 mN and an extension of about 150-300 µm. While ideally fiber pulls would only be considered if the test resulted in a break in the middle of the test specimen, the extremely small diameter of the fibers and large amount of elastic energy stored at break almost always resulted in specimens springing off of the frame, making it exceedingly difficult to assess where fiber failure occurred. All fiber break test results are included in the presented data as a result and it is expected that some of the lower values of strength in particular are a result of fiber breakage near the fiber-tab interface. Elastic modulus was calculated by linear regression fit of all data points in the linear region of the stress-strain curve for a given test such that an $R^2$ value of 0.99 or better was obtained (data points from movement of the testing frame and non-linear behavior at the fiber break point were excluded). The elastic modulus is represented as $E$ while $S(E)$ represents the standard deviation of the elastic modulus. In some datasets, force-displacement curves exhibited a constant offset due to mistaring of the load cell (arising from momentary collision of the tagboard frame top and bottom); accordingly, this offset was subtracted from these datasets in postprocessing.

Carbon fiber strength is inherently limited by flaws in the fibers and is characterized according to ASTM standard test D3379-75 using a Weibull distribution. Weibull distributions are described, for example, in Harlow, E. G. and Phoenix, L., *Journal of Composite Materials*, 1978, 12, pp. 195-214, which is incorporated herein by reference in its entirety for all purposes. The Weibull distribution represents the probability of failure for a fiber at a particular tensile load (i.e., its tensile strength). The probability of failure is given by:

$$p(x) = \begin{cases} \frac{\alpha}{\beta}\left(\frac{x}{\beta}\right)^{\alpha-1} e^{-\left(\frac{x}{\beta}\right)^{\alpha}} & x \geq 0 \\ 0 & x < 0 \end{cases} \quad [2]$$

where x is the parameter of interest (here tensile strength), β is the location parameter, and α is a scale factor (or "Weibull modulus"). It is assumed that fibers have random flaws distributed along them which result in fiber failure according to a weakest-link-in-chain model, and that these flaws follow Weibull-Poisson statistics. Accordingly, the location parameter can be approximated by the mean tensile strength:

$$\beta \approx \bar{x} = \bar{\sigma} \quad [3]$$

and the Weibull modulus, α, can be approximated as the ratio of the mean tensile strength to standard deviation in tensile strength, $S(\bar{\sigma})$:

$$\alpha \approx \frac{\bar{x}}{S} = \frac{\bar{\sigma}}{S(\bar{\sigma})}. \quad [4]$$

These approximations were employed in the data reported in this example. According to ASTM standard test D3379-75, a minimum of 15 successful tests were required for calculation of a valid Weibull distribution. As such, each condition surveyed involved preparation and testing of at least 15 samples with the exception of a few preliminary diagnostic tests. It is noted that the Weibull distributions presented here may be wider than the true distribution as they include all measurements regardless of fiber break point. Testing did not allow for identification of break location and it is anticipated that some fibers broke away from the center of the testing frame (e.g., at the fiber-epoxy interface). The asymmetric bias of the distributions towards lower tensile strength values with increasing number of samples tested supports this hypothesis, as more breaks at the mounting points would be included in the dataset. Weibull parameters derived from tensile tests of single alumina fibers used for CNT growth derived exclusively considering fibers with breaks in the middle of test specimens result in a comparatively narrower Weibull distribution.

Figure 12:
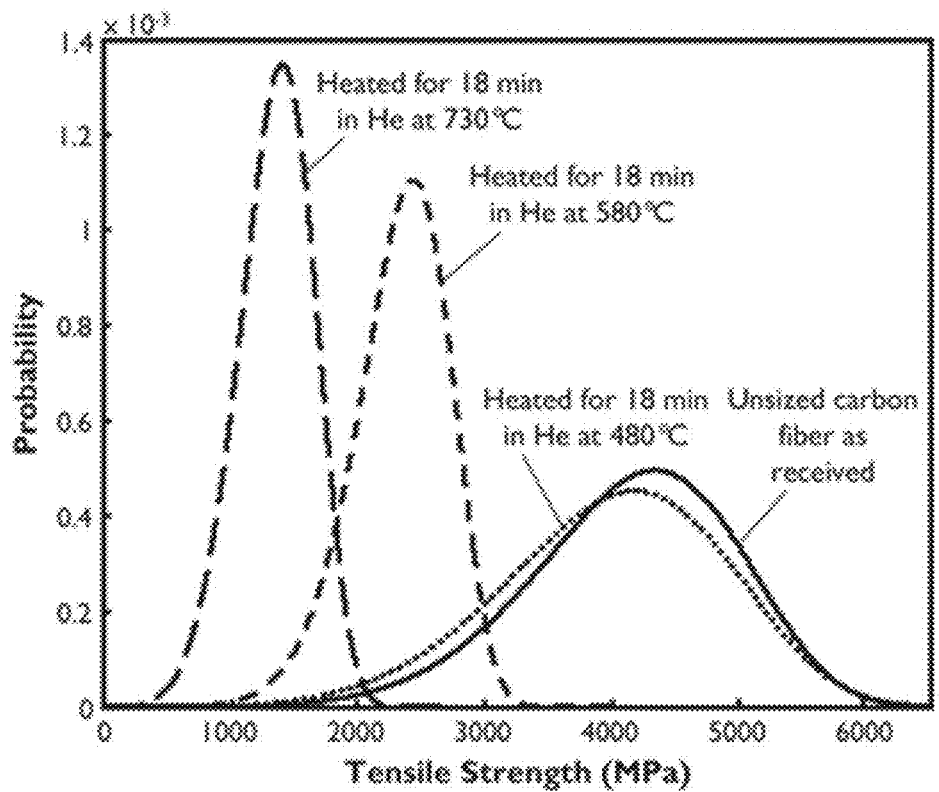
FIG. 12 illustrates Weibull distributions calculated from single-fiber tensile tests of carbon fibers before and after heat treatments, according to certain embodiments.

Table 1 (above) includes a summary of the various thermal processing experiments that were performed, and the resulting tensile strength of the fibers. In one set of experiments, unsized, uncoated HTR-40 fibers were heated to 480° C., 580° C., and 730° C. such that the time the fibers were at or above 480° C. was equal to 18 min. FIG. 12 shows Weibull distributions calculated from tensile tests from samples processed under these conditions. No loss in tensile strength was observed for fibers thermally processed in He at 480° C. However, substantial strength loss was observed in samples heated at 580° C., and additional strength loss over this was observed in samples heated at 730° C.

Figure 13:
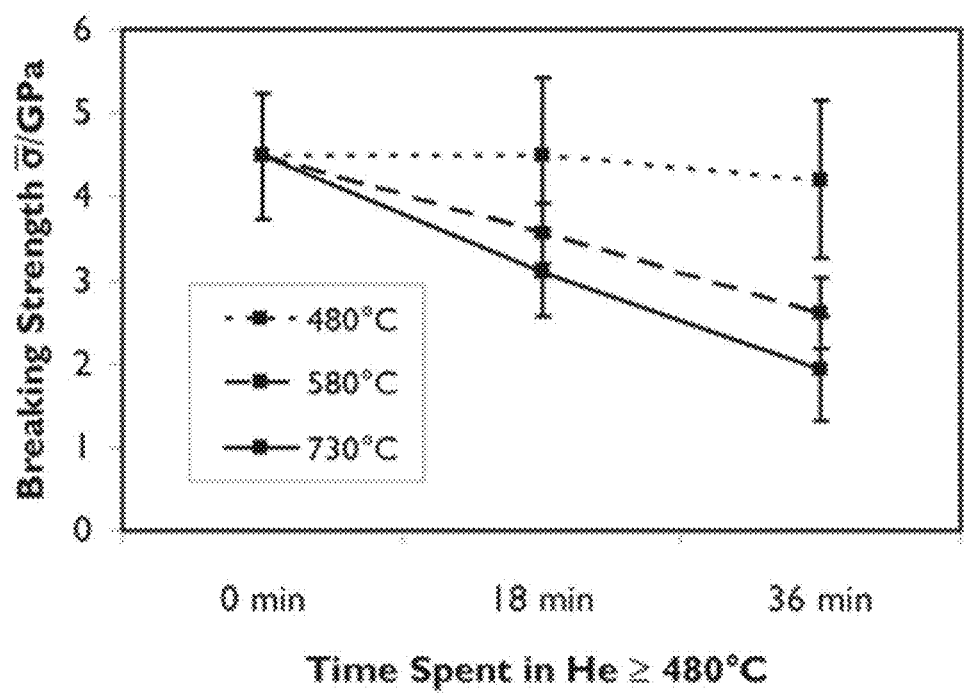
FIG. 13 illustrates, according to certain embodiments, the losses in mean breaking strength of untreated carbon fibers as a function of temperature and time spent at or above 480° C.
Figure 14:
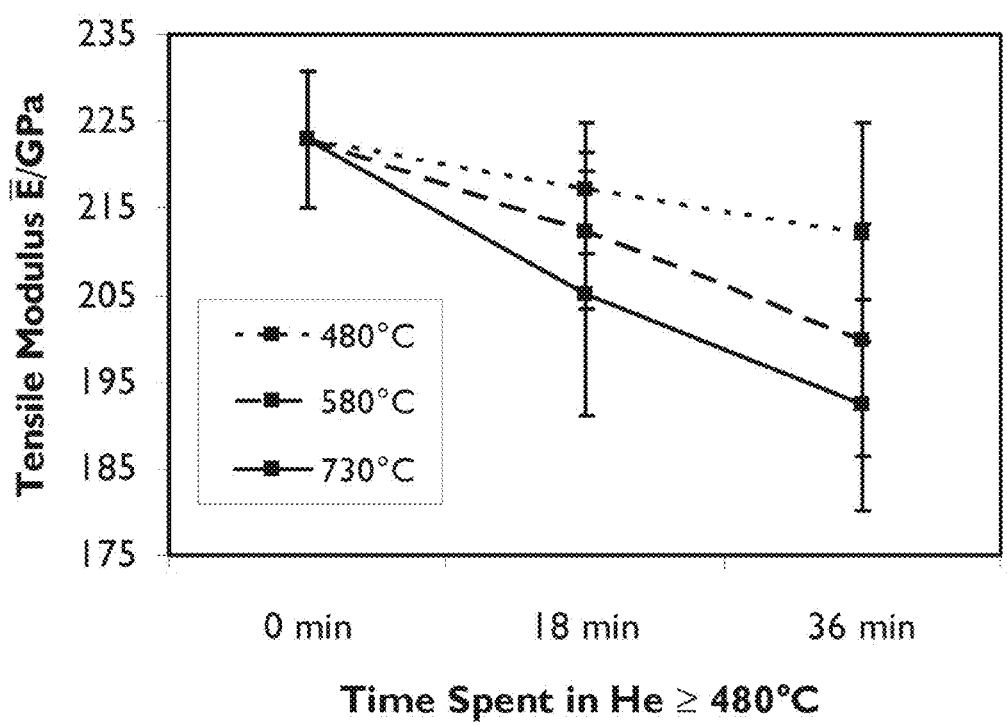
FIG. 14 illustrates, according to some embodiments, the decrease in mean tensile modulus of untreated carbon fibers as a function of temperature and time spent at or above 480° C.

Extending the length of the heat treatment had a further detrimental effect at 580° C. and 730° C., but not noticeably at 480° C. This result suggested that the level of damage was not a function of temperature alone. Both strength (FIG. 13) and stiffness (FIG. 14) were further compromised with longer treatment time at these temperatures. Based on these results, it appeared that a thermally-activated process was responsible for the observed degradation in tensile properties, and primarily occurred above 480° C.

To better characterize the nature of the hypothesized thermally-activated process, thermogravimetric analysis (TGA) was performed with HTR-40 fibers in He atmosphere (3 mg chopped fiber per run). TGA of fibers at a constant heating rate of 100° C. min$^{-1}$ (comparable to what is encountered during CNT growth in the CVD furnace) revealed a sudden change in mass-loss rate beginning at 550° C. Similarly, TGA over the course of 60 min at constant temperatures of 400° C., 500° C., and 650° C. revealed that time-dependent mass loss only occurred at 650° C.

To verify the observed results were not peculiar to the specific TohoTenax carbon fibers that were used, single-fiber tension tests were performed with heat-treated AS4 fibers as well. Breaking strength and tensile stiffness for unsized AS4 as received and after heat treatment in He at 480° C., 580° C., and 730° C. showed similar temperature-dependent declines in these properties, although less severe below 600° C. than HTR-40. Thus the observed responses of the HTR-40 carbon fibers were not isolated to this specific product, but rather, were generally relevant to poly(acrylonitrile)-derived carbon fibers (i.e., PAN-derived carbon fibers) such as HTR-40 and AS4.

Drawing on these results, it was further hypothesized that this mass loss may be correlated with a loss of HCN, the major by-product generated in the pyrolysis of poly(acrylonitrile)-derived carbon fibers such as HTR-40 and AS4. A surface analysis using Auger spectroscopy was performed to detect changes in the nitrogen-to-carbon ratio present on the carbon fiber surface. It was theorized that, if HCN was being volatilized, N must be present in the carbon fiber, and if N was coming off, a decrease in the concentration of N should be measurable. The C:N ratio of unsized HTR-40 fibers as received and after thermal processing in He at 480° C., 580° C., and 730° C. was measured by Auger spectroscopy. A measurable, temperature-dependent loss of N was clearly observed. Notably, the largest drop in N content occurred between the as-received fibers and the fibers heat-treated at 480° C., even though strength and (generally) stiffness were preserved at this temperature.

To gain insights about microstructural changes throughout the bulk of the fiber (the interior core), X-ray diffraction (XRD) was performed on unsized HTR-40 fibers before and after thermal processing in He at 730° C. The as received fibers displayed a superposition of two phases of graphite—one with a very small domain size (tens of nm, the broad peaks at 44° 2-θ and 53° 2-θ) and one with larger domain sizes (hundreds of nm, the sharp peaks at 44° 2-θ and 53° 2-θ and possibly an accentuated feature at 25.7° 2-θ). The disappearance of the phase associated with the larger graphite domain sizes upon heat treatment in He at 730° C., in combination with the chemical changes on the carbon fiber surface observed by Auger spectroscopy, suggested that a microstructural rearrangement within the carbon fiber occurred beginning at 550° C., wherein the minor strength-bearing phase (the highly-oriented surface shell of the fiber) restructured, leaving a weaker phase (the less-oriented interior core of the fiber) as the primary load-bearing continuity.

Not wishing to be bound by any particular theory, it is believed that there exists inherent mechanochemical coupling of fiber strength with chemical aspects of the fiber's microstructure.

EXAMPLE 8

This example describes experiments in which tension was applied to carbon fibers while the fibers are heated to relatively high temperatures, and the resulting effect on the tensile strength of the fibers. The carbon fibers used in this example were the same as those described in Example 7. In addition, the carbon fibers tested in this example underwent the same pre-processing steps as those described in Example 7.

The role of tension during thermochemical processing of carbon fibers was evaluated using a tensioning frame and screw-clamp graphite weights. To prevent chemical contamination, the frame and all fastening parts were machined exclusively out of polycrystalline graphite. The clamp-on weights were used to impart up to 0.5 GPa of tension into single carbon fibers. A set of tungsten-core, graphite-shell weights was also produced and enabled application of tension up to 3.2 GPa.

To mount the fibers onto the tensioning frame, a length of carbon fiber tow (about 30 cm long) was cut and laid out on a clean sheet of copy paper. A "fiber grabber" tool was fashioned to extract fibers from the tow. The fiber grabber tool was made by rolling a piece of masking tape (3M 2600) onto the end of a thin wooden dowel (e.g., a toothpick) to make an approximately 0.5×1.0 cm "flag" of tape hanging off the end of the dowel with the sticky side exposed. This tool was used to gently stick onto single carbon fibers in the bundle and pull them away from the tow through gentle application of torque rather than tension. This was done to minimize stretching or "pretensioning" of fibers during extraction from the tow. Next, with fiber attached to the fiber grabber, the fiber was drawn out and laid across two Para-film-covered fiberglass blocks (about 5 cm×2.5 cm×4.3 mm) separated by a distance of about 18-20 cm, to which the fiber could cling electrostatically. White paper could optionally be placed between the translucent Parafilm and off-white fiberglass to improve contrast of fibers placed atop the blocks. Another, thinner fiberglass block (about 12 cm×5 cm×2.9 mm) without Parafilm was placed nearby for the next step. With a gloved finger, the end of the fiber attached to the fiber grabber tool was pressed down onto its Parafilm-covered fiberglass block and the fiber grabber twisted away and detached. With fiber strung between, the two Parafilm-covered fiberglass blocks were then picked up and carefully placed down and over the larger, thinner fiberglass plate such that the larger plate sat between the two Parafilm-covered blocks lengthwise (12-cm length) with about 3 cm of space between it and each Parafilm-covered block. Once set down, the Parafilm-covered blocks were gently pulled apart to tension the fiber, noting that the fiber was capable of slipping on the Parafilm which self-corrects for and reduces concerns for overtensioning.

Next, graphite clamp weights (or heavier tungsten-core/graphite-shell clamp weights) were readied for attachment to the fibers. The clamp weights were assemblies comprising two small blocks with dimensions of 9.5 mm×9.5 mm×17.8 mm joined at one end with a graphite screw to form a sandwich structure. The screw could be tightened or loosened to open a gap between the two blocks, which sit parallel to each other and perpendicular to the screw thread. Two such weight assemblies, tightened such that an approximately 1 mm gap was left between the two weight blocks, were placed on either side of the long fiberglass plate and pushed against the plate with gap running parallel to and under the fiber, in preparation for the fiber to be laid down into them. The two Parafilm-coated blocks were then carefully picked up and the taught fiber laid into the gaps of the two clamp weight assemblies. Once in place, the screws on the weight assemblies were screwed finger-tight resulting in clamping of the weights onto the fiber.

Once the clamp weights were attached, the fibers were loaded onto the tension frame. The tension frame was placed on top of an adjustable-height lab jack to which a piece of clean white copy paper had been taped. The lab jack was then placed onto a cardboard tray which served as a semi-rigid carrying structure that helped to dampen vibration from walking when moving the fiber-loaded frame (as described below). Two fiberglass plate "guide rails" were also taped down onto the paper to restrict sliding of the tension frame to one dimension. A 6.3-mm-thick prop block was then placed to the left of the tension frame. Pinching both of the clamp weights to pick up the fiber, the fiber-weight assembly was moved over the tension frame. Next, one clamp weight was propped up vertically (screw-side-up) on the prop block on the left side of the tension frame while the other weight was placed on its long edge atop the right side of the tension frame in such a way as to not twist the fiber. Finally, the right weight was carefully pulled and rotated over the right edge of the tension frame and then gently released. The prop block on the left was then carefully removed and the two weights were left dangling off either edge of the frame, holding the fiber in tension over the frame. The fiber loading process was repeated up to three more times, loading the frame with up to four fibers total. Once loaded onto the frames, neither the fiber nor the weights were touched until after processing.

Determining the maximum level of tension that could be reliably applied to single carbon fibers for thermal processing was not straightforward. Carbon fibers of a given length exhibit polydispersity in their tensile strengths. Accordingly, the maximum applicable tension for a given length of fiber varies from specimen to specimen and is not knowable in advance of tensile testing. The maximum applicable tension is, at a minimum, less than the fiber's breaking strength by some increment, and in practice, may be even less due to limitations arising from gripping, dynamic loading, and variations in material quality.

Assuming $T_{app}$ represents the tension applied to a single fiber, one can set the maximum tension that can be practicably applied to a fiber, $T_{max}$, equal to the mean breaking strength measured for fibers of the same type as determined by single-fiber tensile tests. The tension applied to a fiber can then be expressed as a proportion of the approximate maximum applicable tension with the dimensionless ratio $R_T=T_{app}/T_{max}$. In this example, single fiber loadings of $R_T=0.12$, $R_T=0.45$, and $R_T=0.75$ were investigated. At tensions of $R_T=0.75$, less than 1 in 10 fibers survived thermal processing. Accordingly, this level of tension was not studied in depth.

Once the fibers had been loaded onto the tension frame, and the tensile force was applied, the fibers were then transferred to the tube furnace for thermal processing. To accomplish this, the cardboard tray under the lab jack was carefully and slowly picked up and the lab jack (with loaded tensioning frame on top) was moved and placed in proximity to the tube furnace using extreme care so as to not impart dynamic loading onto the fibers. With a process tube inside the furnace, the lab jack was placed next to the furnace and raised to the height of the process tube so that the tension frame could be smoothly pushed into position with a push rod.

Thermal processing was then performed by heating the fiber samples. Table 2 includes a summary of the tests that were performed.

TABLE 2

Summary of single-fiber tensile test data for carbon fibers thermally processed in He atmosphere under tension as single fibers and control samples processed untensioned as tows.

| Sample Description | Processed as | No. of Samples | $\bar{\sigma}$/ GPa (= β) | $S(\bar{\sigma})$/ GPa | Weibull Modulus α | $\bar{E}$/ GPa | $S(\bar{E})$/ GPa |
|---|---|---|---|---|---|---|---|
| Low Tension Study |||||||||
| Unsized HTR-40, untensioned, 730° C. in He, 18 min ≥ 480° C. | Tow on Tension Frame | 20 | 3.91 | 1.07 | 3.66 | 214 | 17.6 |
| Unsized HTR-40, tensioned ($R_T = 0.12$), 730° C. in He, 18 min ≥ 480° C. | Single Fibers on Tension Frame | 21 | 4.46 | 0.72 | 6.23 | 215 | 10.7 |

TABLE 2-continued

Summary of single-fiber tensile test data for carbon fibers thermally processed in He atmosphere under tension as single fibers and control samples processed untensioned as tows.

| Sample Description | Processed as | No. of Samples | $\bar{\sigma}$/ GPa (= β) | $S(\bar{\sigma})$/ GPa | Weibull Modulus α | $\bar{E}$/ GPa | $S(\bar{E})$/ GPa |
|---|---|---|---|---|---|---|---|
| Moderate Tension Study | | | | | | | |
| Unsized HTR-40 | Tow | 19 | 3.46 | 0.79 | 4.40 | 212 | 12.5 |
| Unsized HTR-40, tensioned ($R_T$ = 0.45 730° C. in He, 18 min ≥ 480° C. | Single Fibers on Tension Frame | 24 | 3.10 | 0.71 | 4.36 | 202 | 11.6 |

Following thermal processing, the frame was pulled out of the furnace by one of its horns and placed back onto the lab jack and the fibers were removed by grabbing both weights of each fiber simultaneously, slacking the fiber, and resting it on a surface with the weights. Some fibers were found to break spontaneously during thermal processing or from bumping or vibration during loading, observable by the presence of a dropped weight next to the frame. Such fibers were no longer considered valid for tensile tests. Each fiber on the frame could be cut in half to afford two tensile test specimens.

Figure 15:
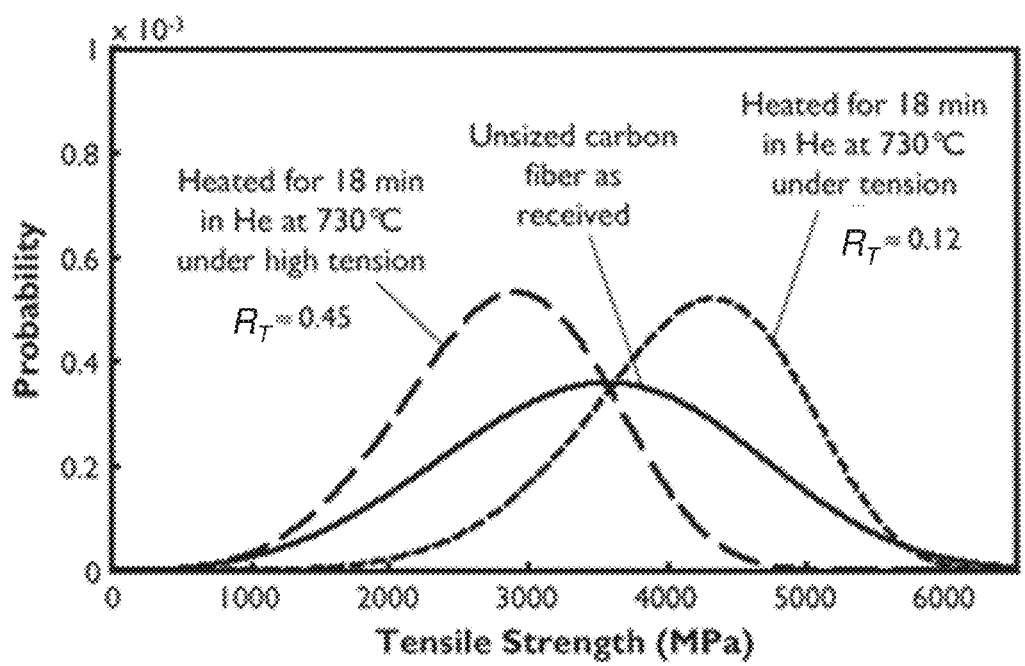
FIG. 15 includes Weibull distributions calculated from tensile tests of tensioned carbon fibers, according to some embodiments.

Tensile testing was performed according to ASTM standard test D3379-75, as described in Example 7. Test results are summarized in Table 2. FIG. 15 shows Weibull distributions calculated from tension tests performed on unsized HTR-40 fibers as received and after heat treatment at 730° C. (at or above 480° C. for 18 min) with $R_T$=0.12 and $R_T$=0.45. The application of a low level of tension ($R_T$=0.12) was found not only to preserve carbon fiber tensile stiffness and strength upon thermal processing at 730° C. but possibly also to enhance tensile strength. Interestingly, the higher level of tension ($R_T$=0.45) resulted in the loss of about 10% of the tensile strength (although this was still a 20-25% improvement in strength retention compared with untensioned thermal processing of fibers. These experiments demonstrated that the application of a low level of tension is a viable strategy for preserving fiber strength and stiffness during CNT growth on carbon fibers.

EXAMPLE 8

This example describes the mechanical testing of K-PMSA-coated carbon fibers on which carbon nanotubes have been grown. $CO_2/C_2H_2$ chemical vapor deposition was used to grow carbon nanotubes on HTR-40 carbon fibers coated with $Fe^{3+}$-loaded K-PSMA at 480° C., as described in Example 6. The tested carbon fibers were coated with K-PSMA (from h-PSMA initially acidified with NaOH to a pH of 8 then neutralized with $K_2CO_3$ to a pH of 11) and dip-coated with 0.050 M $Fe^{3+}$/IPA solution aged for 60 min. The fibers were then processed in a 1" CVD furnace first under 400 sccm hydrogen on ramp-up to 480° C. to reduce the $Fe^{3+}$ to iron nanoparticles, and then 17 sccm $CO_2$/167 sccm 10% $C_2H_2$ in Ar for 15 min to grow CNTs by oxidative dehydrogenation.

Figure 16:
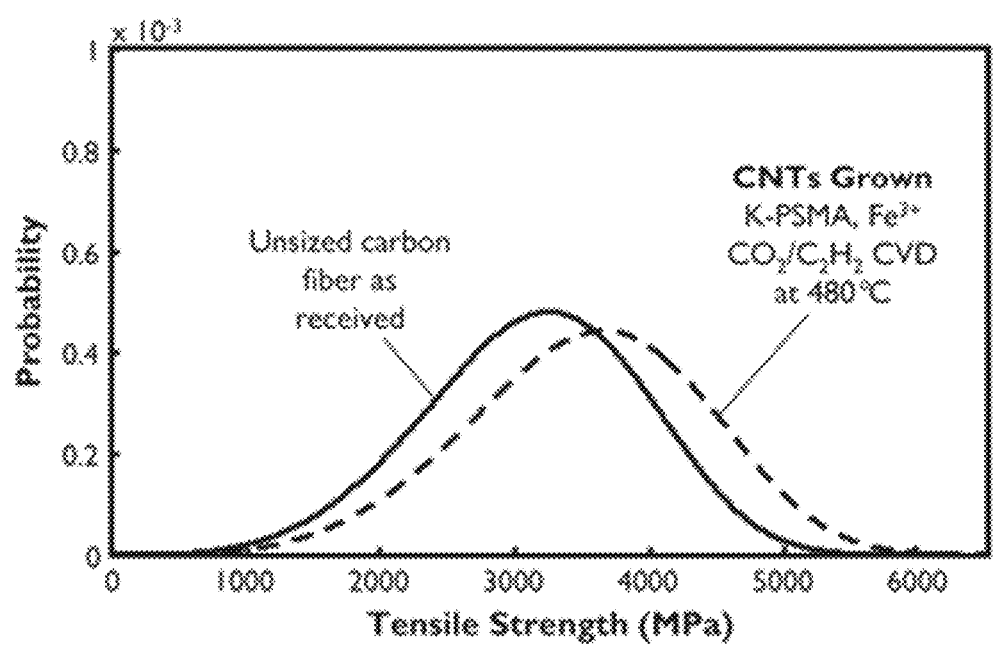
FIG. 16 illustrates, according to one set of embodiments; Weibull distributions calculated from tensile tests of carbon fibers coated with $Fe^{3+}$-loaded K-PSMA coatings and subsequently CVD processed.

Tension tests were performed using the devices and methods described in Example 7. FIG. 16 includes Weibull distributions calculated from tensile tests of carbon fibers coated with $Fe^{3+}$-loaded K-PSMA coatings and subsequently CVD processed. Table 3 summarizes tension tests performed on unsized HTR-40 and CVD-processed $Fe^{3+}$/K-PSMA-coated HTR-40 fibers. As illustrated in Table 3, the carbon fibers unexpectedly exhibited no substantial changes in breaking strength or tensile modulus after carbon nanotube growth. This example demonstrates that CNT growth can be achieved on high-performance carbon fibers without resulting in degradation of fiber tensile properties.

TABLE 3

Summary of single-fiber tensile test data for carbon fibers coated with $Fe^{3+}$-loaded K-PSMA CVD processed for CNT growth with $CO_2/C_2H_2$, and as-received control samples.

| Sample Description | Processed as | No. of Samples | $\bar{\sigma}$/ GPa (= β) | $S(\bar{\sigma})$/ GPa | Weibull Modulus α | $\bar{E}$/ GPa | $S(\bar{E})$/ GPa |
|---|---|---|---|---|---|---|---|
| Unsized HTR-40* | Tow | 19 | 3.46 | 0.79 | 4.40 | 212 | 12.5 |
| K-PSMA/$Fe^{3+}$ on HTR-40, $CO_2/C_2H_2$ CVD at 480° C. | Tow | 20 | 3.88 | 0.85 | 4.55 | 213 | 13.2 |

*Repeat of listing from Table 2; served as control for moderate tension study and CNT growth study.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of growing carbon-based nanostructures, comprising:
    applying a tensile force to a carbon fiber over which a nanopositor is positioned; and
    exposing a carbon-based nanostructure precursor to the nanopositor under conditions causing the formation of carbon-based nanostructures on the nanopositor while the tensile force is applied to the carbon fiber,
    wherein the magnitude of the tensile force is such that it defines a stress that is greater than about 5% of the breaking strength of the carbon fiber.

2. A method as in claim 1, wherein the nanopositor is in direct contact with the carbon fiber.

3. A method as in claim 1, wherein an intermediate material is positioned between the carbon fiber and the nanopositor.

4. A method as in claim 1, wherein the carbon-based nanostructures comprise carbon nanotubes.

5. A method as in claim 1, wherein the carbon-based nanostructures comprise carbon nanofibers.

6. A method as in claim 1, wherein the carbon fiber is part of a weave of fibers.

7. A method as in claim 1, wherein the carbon fiber is part of a bundle of fibers.

8. A method as in claim 1, wherein the carbon fiber is substantially free of contact with other fibers.

9. A method as in claim 1, wherein the nanopositor comprises an elemental metal and/or a metal oxide.

10. A method as in claim 9, wherein the nanopositor comprises an elemental metal.

11. A method as in claim 10, wherein the nanopositor comprises elemental iron.

12. A method as in claim 1, wherein the nanopositor comprises iron.

13. A method as in claim 1, wherein the conditions causing formation of the carbon-based nano structures comprise a temperature of less than about 600° C.

14. A method as in claim 1, wherein the nanopositor comprises a catalyst.

15. A method as in claim 3, wherein the intermediate material comprises a polyeletrolyte.

16. A method as in claim 15, wherein the intermediate material comprises a polyelectrolyte incorporating carboxylate, sulfonate, carbonate, bicarbonate, amine, ammonium, phosphate, and/or phosphonate groups.

17. A method as in claim 3, wherein the intermediate material is in the form of a substantially conformal coating over the carbon fiber.

18. A method as in claim 1, wherein the magnitude of the tensile force is such that it defines a stress that is greater than about 10% of the breaking strength of the carbon fiber.

19. A method as in claim 1, wherein the magnitude of the tensile force is such that it defines a stress that is less than about 75% of the breaking strength of the substrate.

20. A method as in claim 1, further comprising, prior to applying the tensile force to the carbon fiber, affixing at least one end of the carbon fiber to stationary or moveable mount.

* * * * *

UNITED STATES PATENT AND TRADEMARK OFFICE
CERTIFICATE OF CORRECTION

PATENT NO. : 9,540,243 B2
APPLICATION NO. : 14/216487
DATED : January 10, 2017
INVENTOR(S) : Stephen A. Steiner, III et al.

It is certified that error appears in the above-identified patent and that said Letters Patent is hereby corrected as shown below:

In the Claims

In Claim 13, at Column 40, Line 52, "nano structures" should read -- nanostructures --

Signed and Sealed this
Twenty-third Day of January, 2018

Joseph Matal
*Performing the Functions and Duties of the
Under Secretary of Commerce for Intellectual Property and
Director of the United States Patent and Trademark Office*